(12) United States Patent
Hoshino

(10) Patent No.: US 8,514,113 B2
(45) Date of Patent: Aug. 20, 2013

(54) ANALOG-TO-DIGITAL CONVERSION APPARATUS AND OFFSET VOLTAGE CORRECTION METHOD

(75) Inventor: Masanori Hoshino, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 95 days.

(21) Appl. No.: 13/195,841

(22) Filed: Aug. 2, 2011

(65) Prior Publication Data
US 2012/0098683 A1    Apr. 26, 2012

(30) Foreign Application Priority Data

Oct. 25, 2010  (JP) .................................. 2010-238455

(51) Int. Cl.
*H03M 1/06*    (2006.01)

(52) U.S. Cl.
USPC .......................................... 341/118; 341/155

(58) Field of Classification Search
USPC ................. 341/118, 156, 155, 154, 172, 120, 341/119, 117
See application file for complete search history.

(56) References Cited

U.S. PATENT DOCUMENTS

| | | | | |
|---|---|---|---|---|
| 5,214,430 A | * | 5/1993 | Gulczynski | 341/120 |
| 5,463,395 A | * | 10/1995 | Sawai | 341/156 |
| 6,304,208 B1 | * | 10/2001 | Nagashima | 341/172 |
| 6,900,749 B2 | * | 5/2005 | Tani et al. | 341/118 |
| 7,420,499 B2 | * | 9/2008 | Sakata et al. | 341/155 |

FOREIGN PATENT DOCUMENTS

| | | |
|---|---|---|
| JP | 11-330965 | 11/1999 |
| JP | 2000-165241 | 6/2000 |

OTHER PUBLICATIONS

Chun-Ying, Chen et al., "A Low Power 6-bit Flash ADC with Reference Voltage and Common-Mode Calibration", 2008 Symposium on VLSI Circuits Digest of Technical Papers, 2008, pp. 12-13.
Yuko, Tamba et al., "A COMS 6b 500M Sample/s ADC for a Hard Disk Drive Read Channel", 1999 IEEE International Solid-State Circuits Conference, 474 ISSCC99/SESSION 18/Paper WA 18.5, 1999, pp. 324-325.

* cited by examiner

*Primary Examiner* — Jean B Jeanglaude
(74) *Attorney, Agent, or Firm* — Fujitsu Patent Center

(57) ABSTRACT

An analog-to-digital conversion apparatus has a plurality of comparators configured to compare each of a plurality of different reference voltages and an input signal voltage in a parallel manner, a switch unit configured to switch the input signal voltage to a voltage corresponding to an analog input signal voltage or one of the plurality of reference voltages, an encoder configured to convert comparison results of the plurality of comparators into digital signals, and a digital assist circuit configured to control the switch unit so that the input signal voltage has a potential corresponding to the reference voltage in the comparator being the correction target among the plurality of comparators, to generate correction data for correcting the offset voltage generated in the comparator being the correction target based on the digital signal and to output it to the comparator being the correction target.

19 Claims, 21 Drawing Sheets

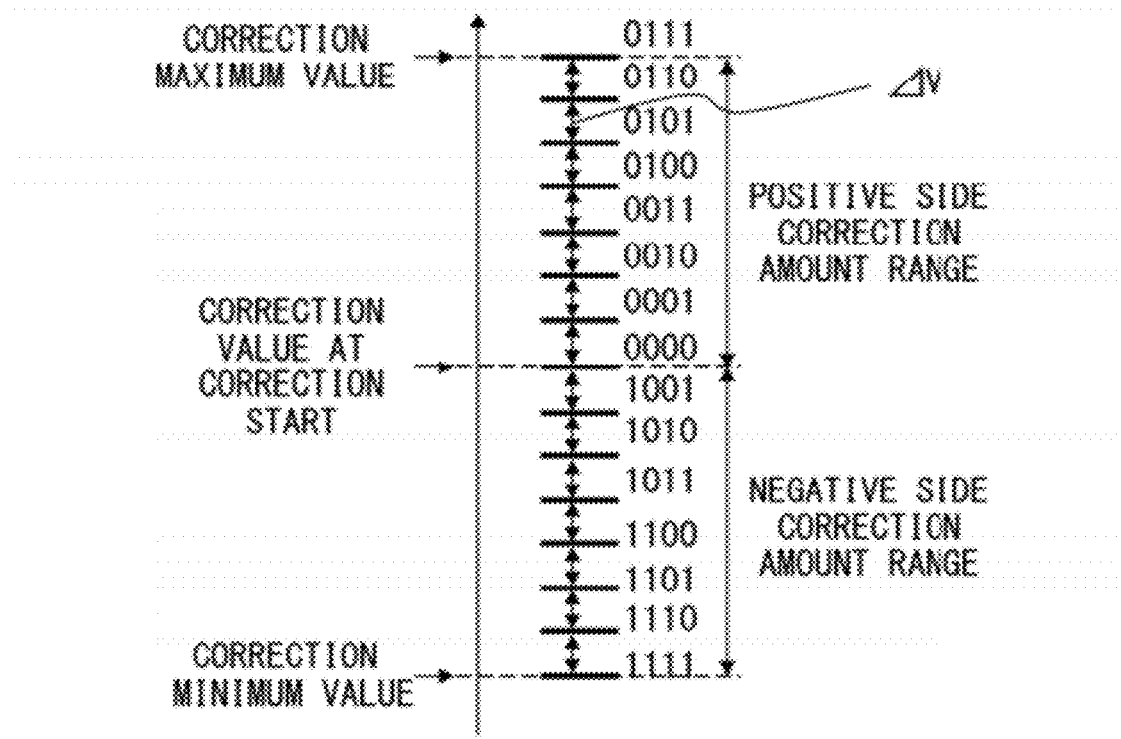
F I G. 15

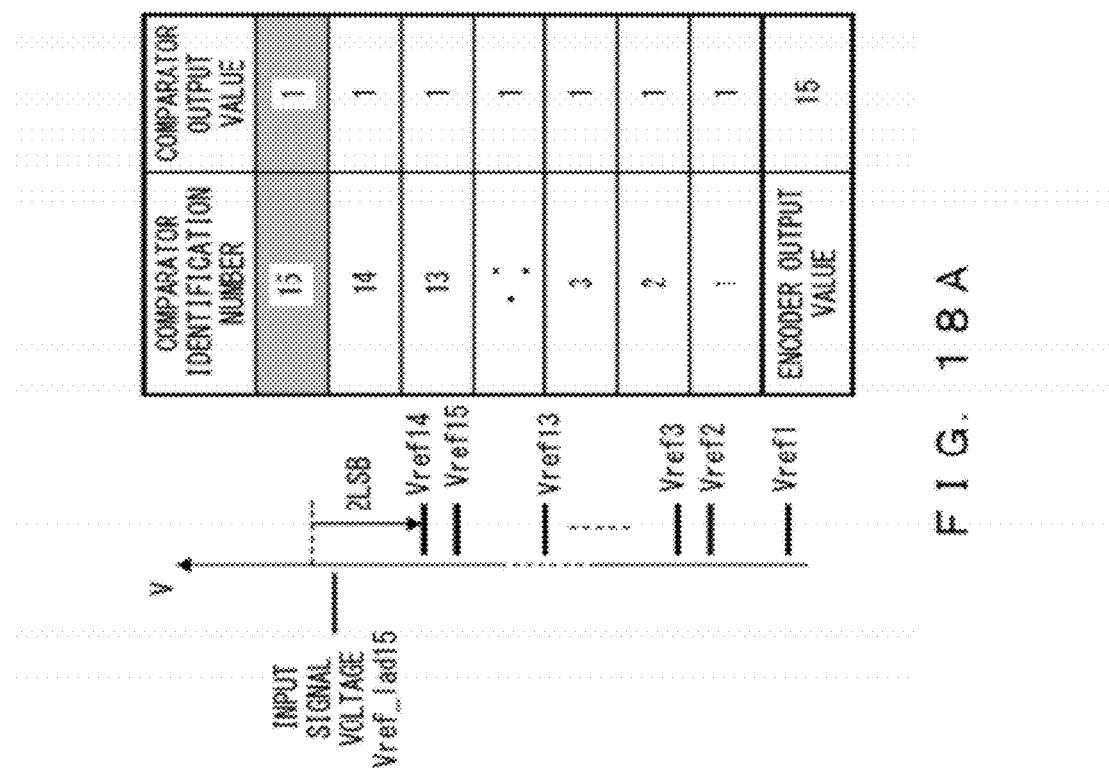
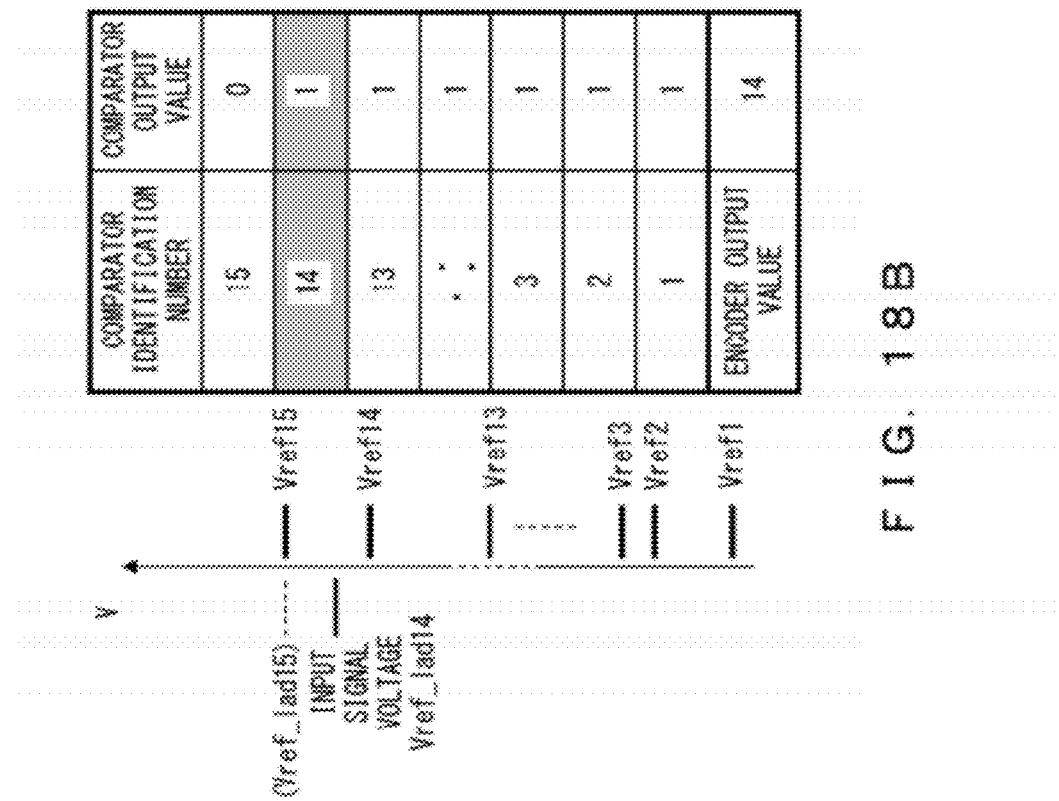
FIG. 18A
FIG. 18B

ANALOG-TO-DIGITAL CONVERSION APPARATUS AND OFFSET VOLTAGE CORRECTION METHOD

CROSS-REFERENCE TO RELATED APPLICATIONS

This application is based upon and claims the benefit of priority of the prior Japanese Patent Application No. 2010-238455, filed on Oct. 25, 2010, the entire contents of which are incorporated herein by reference.

FIELD

The embodiments discussed herein are related to an analog-to-digital conversion apparatus, and, a method for correcting the offset voltage of a comparator.

BACKGROUND

An analog-to-digital conversion circuit (hereinafter, referred to as "ADC") that is a typical example of an analog digital conversion apparatus has various circuits including a comparator used for voltage comparison. Therefore, if an offset voltage is generated between comparison voltages due to variation in transistor characteristics or asymmetric circuit layout, there is a concern that correct comparison results cannot be obtained, which would negatively affect the operation of the ADC.

Then, an ADC having a function to perform control so as to cancel the offset voltage generated in the comparator has been proposed. For example, as a parallel comparison system (also called as a "flash type") ADC, an ADC having a circuit that performs control so as to cancel the offset voltage generated in the comparator based on the output signal of the comparator has been proposed (for example, see Patent Document 1, Non-patent Documents 1 and 2). Hereinafter, a circuit that performs control so as to cancel the offset voltage is simply referred to as an OFC circuit (offset cancel circuit). In an ADC of the parallel comparison system having an OFC circuit, the OFC circuit is provided for every comparator, and the corresponding comparators and OFC circuits are connected by signal lines respectively.

[Patent Document 1] Japanese Laid-open Patent Publication No. 2000-165241

[Non-patent Document 1] Chun-Ying Chen, Michael Le, Kwang Young Kim [A Low Power 6-bit Flash ADC with Reference Voltage and Common-Mode Calibration]2008 Symposium on VLSI Circuits Digest of Technical Papers p. 12-13

[Non-patent Document 2] Yuko Tamba, Kazuo Yamakido [A COMS 6b 500MSample/s ADC for a Hard Disk Drive Read Channel] 1999 IEEE International Solid-State Circuits Conference p. 324-325, 474 ISSCC99/SESSION 18/PAPER WA 18.5

In an ADC of the parallel comparison method, assuming the number of bits of an output digital signal as n, 2n−1 units of comparators are required. Therefore, in an ADC in the parallel comparison method having an OFC circuit, assuming the number of bits of digital signal as n, 2n−1 units of comparators are required, so 2n−1 lines of the signal lines connecting the corresponding comparators and the OFC circuits respectively are also required. For example, assuming the number of bits of the digital signal as 4, 15 units of comparators are required, so the 15 lines of signal lines connecting the corresponding comparators and OFC circuits are required.

Therefore, in the parallel comparison method having an OFC circuit, when the number of bits of the digital signal is increased by 1, approximately twice the number of units of signal lines connecting the corresponding comparators and OFC circuits respectively are required.

As described above, an attempt to increase the number of bits of the digital signal in an ADC of the parallel comparison system having OFC circuits increases the number of lines connecting the corresponding comparators and OFC circuits respectively, and the circuit becomes crowded as a result.

SUMMARY

According to a perspective of an apparatus, an analog-to-digital conversion apparatus having a plurality of comparators, a switching unit, a conversion unit, and a correction data generation unit is provided. Here, the plurality of comparators compare each of a plurality of different reference voltages and an input signal voltage in a parallel manner. The switching unit switches the input signal voltage to an analog input signal voltage, or, a voltage corresponding to one of the plurality of reference voltages. The conversion unit converts comparison results of the plurality of comparators into digital signals. The correction data generation unit controls the switching unit so that the input signal voltage has a potential corresponding to the reference voltage in the comparator being the correction target. Further, the correction data control unit generates correction data for correcting an offset voltage generated in the comparator being the correction target based on the digital signal, and outputs the correction data to the comparator being the correction target.

According to a perspective of a method, an offset voltage correction method for an analog-to-digital conversion apparatus having a process to set, a process to control, a process to convert, a process to generate and a process to output is provided. Here, in the process to set, a comparator being the correction target is set among a plurality of comparators configured to compare each of a plurality of different reference voltages and an input signal voltage. In the process to control, control is performed so that the input signal voltage has a potential corresponding to the reference voltage of the comparator being the correction target in the comparator being the correction target. In the process to convert, comparison results of the plurality of comparators are converted into digital signals. In the process to generate, correction data for correcting an offset voltage generated in the comparator being the correction target is generated based on the digital signal. In the process to output, the correction data is output to the comparator being the correction target.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 15 is a diagram illustrating a correction amount range in which the offset voltage can be corrected by correction data in an ADC being an analog-to-digital conversion apparatus according to embodiment 2.

FIGS. 18A, B are diagrams illustrating a case in which the offset correction operation of an ADC being an analog-to-digital conversion apparatus according to embodiment 2 is performed in the example illustrated in FIG. 14B.

DESCRIPTION OF EMBODIMENTS

Hereinafter, embodiments are explained with reference to drawings.

Embodiment 1

An analog-to-digital conversion apparatus according to embodiment 1 is an ADC in the parallel comparison system that converts an analog signal to 4-bit digital signal. The ADC is capable of performing, other than the analog-to-digital conversion operation as the normal operation, an operation to correct the offset voltage (offset correction operation) for each of a plurality of comparators.

Figure 1:
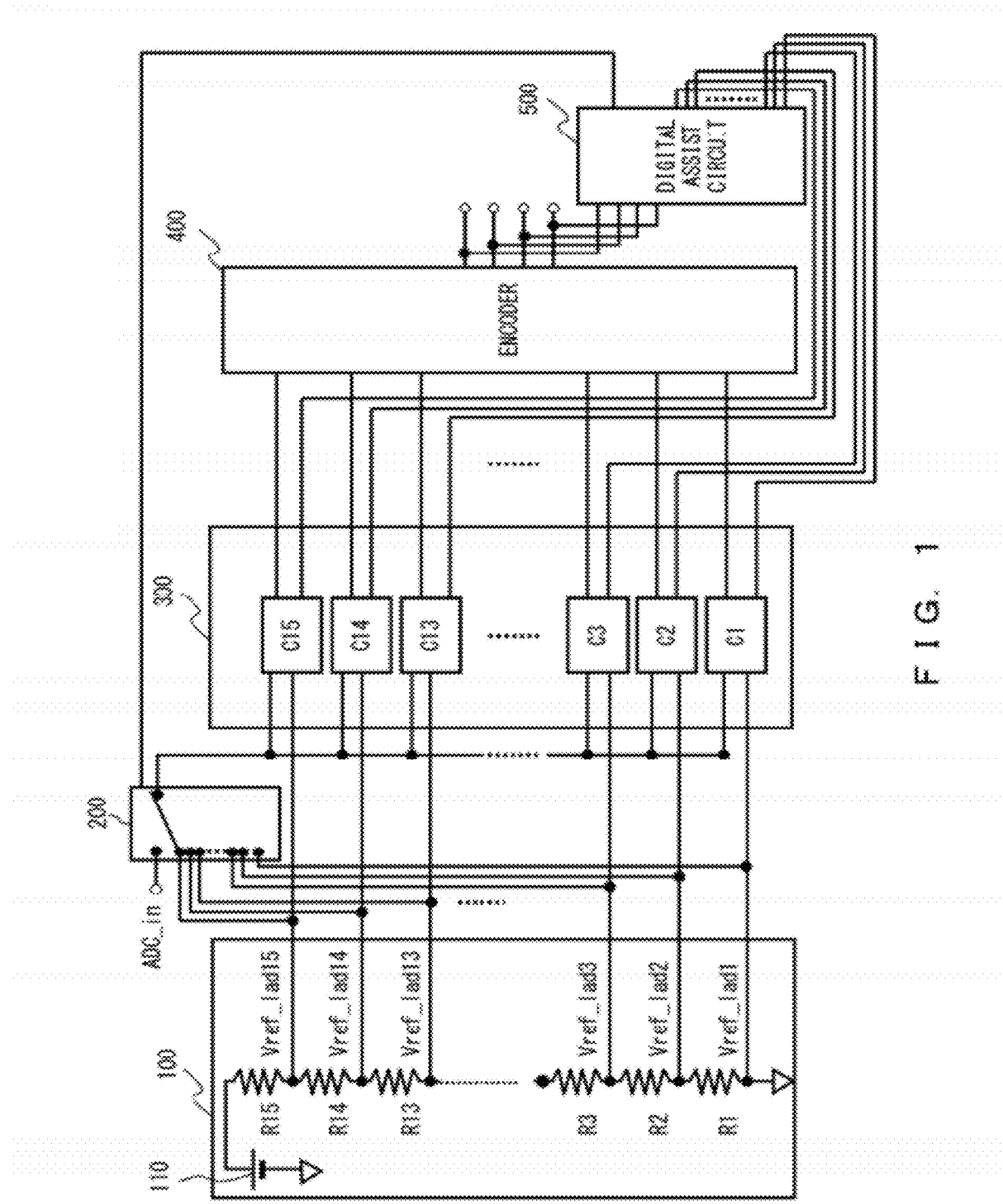
FIG. 1 is a diagram illustrating a configuration example of an ADC being an analog-to-digital conversion apparatus according to embodiment 1.

FIG. 1 is a diagram illustrating a configuration example of an ADC according to the present embodiment.

As illustrated in FIG. 1, the ADC according to the present embodiment includes a ladder resistance unit 100, a switch unit 200, a comparator unit 300, an encoder 400 and a digital assist circuit 500.

Here, the ladder resistance unit is an example of a voltage generation unit. The switch unit 200 is an example of a switching unit. The encoder 400 is an example of a conversion unit. The digital assist circuit 500 is an example of a correction data generation unit.

The ladder resistance unit 100 includes 15 units of resistors R1 through R15 and a reference power source 110. The ladder resistance unit 100 generates 15 different reference voltages Vref_lad1 through Vref_lad15 by dividing the voltage of the reference power source 110 using the serially-connected resistors R1 through R15. Meanwhile, in the reference voltages Vref_lad1 through Vref_lad15, the electric potential becomes larger in the direction from the reference voltage Vref_lad1 to Vref_lad15.

The switch unit 200 switches a signal input from the switch unit 200 to the comparator unit 300 to an analog input signal (ADC_in), or any one of 15 reference voltage signals generated by the ladder resistance unit 100. Meanwhile, the switch unit 200 performs such switching according to a switching control signal input from the digital assist circuit 500. Accordingly, the switch unit 200 can switch a signal input from the switch unit 200 to the comparator unit 300 to a signal of a voltage with the same electric potential as that of any one of the 15 reference voltages generated by the ladder resistance unit 100.

The comparator unit 300 includes 15 units of comparators C1 through C15 in the same configuration. Here, the comparators C1 through C15 are an example of a plurality of comparators. The comparators C1 through C15 compare, in a parallel manner, each of the 15 reference voltages input directly from the ladder resistance unit 100 with the voltage of the signal input from the switch unit 200. In addition, each of the comparators C1 through C15 corrects the offset voltage generated in the comparator according to correction data input from the digital assist circuit 500.

The encoder 400 converts the comparison results of the comparators C1 through C15, that is, their output signals into 4-bit digital signals. Meanwhile, the encoder 400 in the present embodiment is assumed to be a straight binary type.

The digital assist circuit 500 outputs a switching control signal to the switch unit 200, to control the switching of the switch unit 200. For example, at the time of the normal operation, the switching of the switch unit 200 is controlled so that an analog input signal is input to the comparator unit 300. In addition, at the time of the offset correction operation, the switching of the switch unit 200 is controlled so that any one of the signals of 15 reference voltages generated by the ladder resistance unit 100 is input to the comparator unit 300. In addition, at the time of the offset correction operation, the digital assist circuit 500 generates and stores, for each of the comparators C1 through C15, correction data for correcting the offset voltage generated in the comparator according to the output signal of the encoder 400. In addition, at the time of the normal operation and the offset correction operation, the digital assist circuit 500 outputs the stored correction data for the comparators C1 through C15 to the comparators C1 through C15.

Meanwhile, in the ADC according to the present embodiment, the correction data is 3-bit data. The highest order bit of the 3-bit data is used as a sign bit, and when it is "0", it indicates that the value of the correction data (correction value) is positive, and when it is "1", it indicates that the value of the correction data (correction value) is negative.

Figure 2:
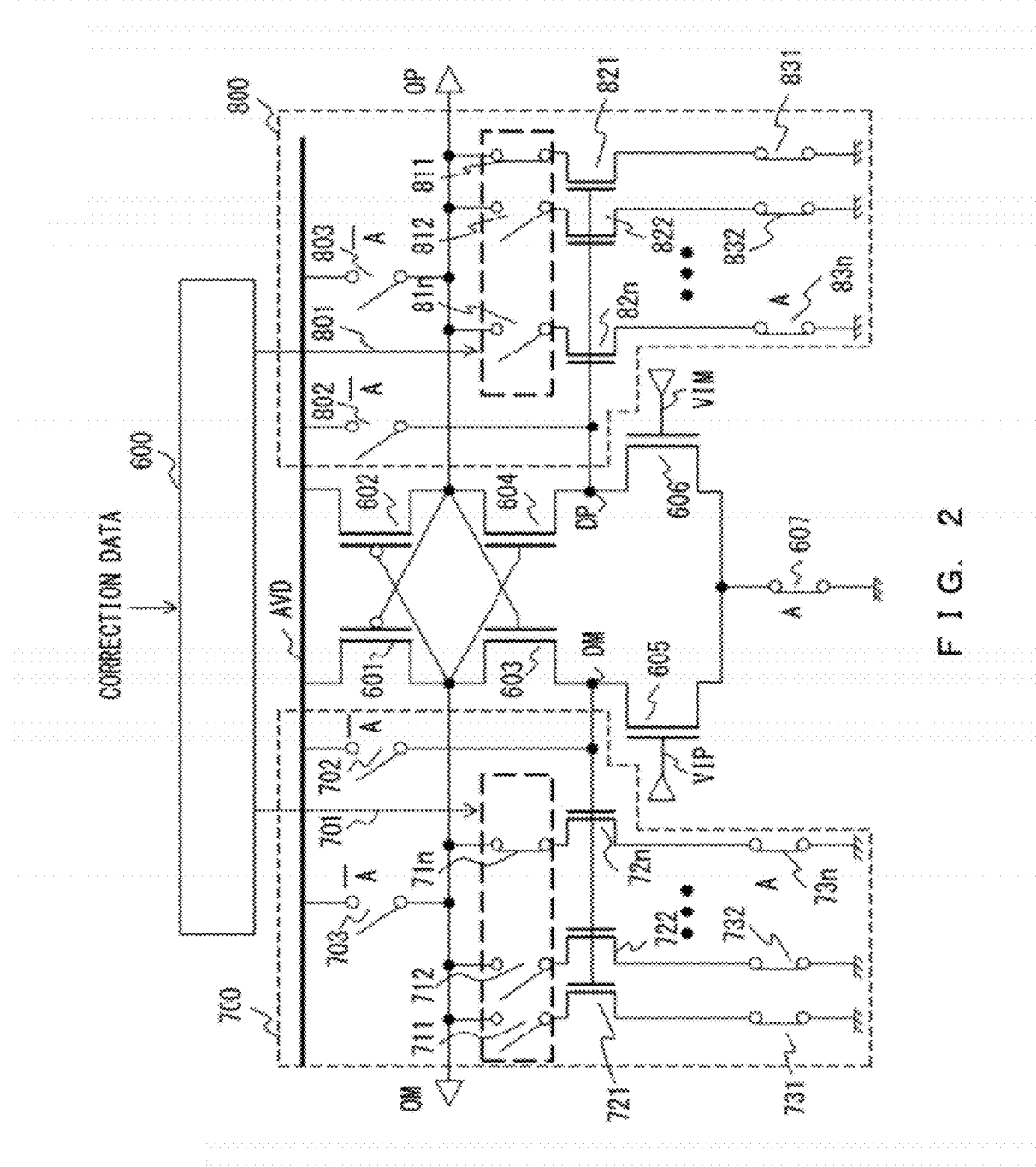
FIG. 2 is a diagram illustrating a configuration example of a comparator used as each of comparators C1 through C15.

FIG. 2 is a diagram illustrating a configuration example of a comparator used as each of the comparators C1 through C15.

As a basic operation, the comparator compares the voltage of a signal (presented as "VIM" in FIG. 2) input directly from the ladder resistance unit 100, and the voltage of a signal (presented as "VIP" in FIG. 2) input from the switch unit 200. Then, if the signal input from the switch unit 200 has a higher electric potential, a voltage corresponding to logic "H" ("1") is output. On the other hand, if the signal output from the switch unit 200 has a lower electric potential, a voltage corresponding to "L" ("0") is output.

Hereinafter, the voltage of the signal input directly from the ladder resistance unit 100 to the comparator is also referred to as a reference voltage, and the voltage of the signal input from the switch unit 200 to the comparators is also referred to as an input signal voltage. In addition, the state in which the output value of the comparator is a voltage corresponding to logic "H" ("1") is also referred to as the output value of the comparator being "1". In addition, the state in which the output value of the comparator is a voltage corresponding to logic "L" ("0") is also referred to as the output value of the comparator being "0".

As illustrated in FIG. 2, the comparator includes a data conversion unit 600, an offset correction units 700, 800, a P-type MOS transistors 601, 602, N-type MOS transistors 603, 604, 605, 606, and a switch 607.

The source of the P-type MOS transistor 601 is connected to a high potential line AVD, and its drain is connected to the drain of the N-type MOS transistor 603, and its gate is connected to the drain of the N-type MOS transistor 604. Meanwhile, the drain of the P-type MOS transistor 601 is connected to an output terminal from which an output signal OM is output. However, in this example, the output signal OM does not need to be output to the outside from the output terminal.

The source of the N-type MOS transistor 603 is connected to the node DM, and its gate is connected to the drain of the N-type MOS transistor 604. The source of the N-type MOS transistor 605 is connected to one of electrodes of the switch 607, and its gate is connected to a signal line in which the input signal VIP propagates. Meanwhile, as described above, the input signal VIP is a signal input from the switch unit 200.

As described above, the P-type MOS transistor 601, the N-type MOS transistor 603, the N-type MOS transistor 605 are connected in series between the switch 607 and the high potential line AVD by their source and drain, forming the first current pathway including the node DM. Meanwhile, the current in the first current pathway is controlled and increased/decreased by the N-type MOS transistors according to the potential of the input signal VIP.

The source of the P-type MOS transistor 602 is connected to the high potential line AVD, and its drain is connected to the drain of the N-type MOS transistor 604, and its gate is connected to the drain of the N-type MOS transistor 603. Meanwhile, the drain of the P-type MOS transistor 602 is connected to an output terminal from which an output signal OP is output. Here, the output signal OP is an output signal from the comparator.

The source of the N-type MOS transistor 604 is connected to a node DP, and its gate is connected to the drain of the N-type MOS transistor 603. The source of the N-MOS transistor 606 is connected to one of electrodes of the switch 607, and its gate is connected to a signal line in which the input signal VIM propagates. Meanwhile, as described above, the input signal VIM is a signal input directly from the ladder resistance unit 100.

As described above, the P-type MOS transistor 602, the N-type MOS transistor 604, the N-type MOS transistor 606 are connected in series between the switch 607 and the high potential line AVD by their source and drain, forming the second current pathway including the node DP. Meanwhile, the current in the second current pathway is controlled and increased/decreased by the N-type MOS transistors according to the potential of the input signal VIM.

Meanwhile, the switch 607 is a switch to connect or disconnect the source of the N-type MOS transistors 605, 606 and the ground line, according to the potential of a clock signal A. Here, the clock signal A is a signal input from outside of the ADC according to the present embodiment for example. The operation of the ADC according to the present embodiment is performed in synchronization with the clock signal A.

As described above, the transistors belonging to the first current pathway and the second current pathway and the switch 607 amplifies the difference in the potentials of the nodes connected to the output terminals OM, OP, and make the potential of the one having the higher potential logic "H", and make the potential of the one having the lower potential logic "L". Therefore, the transistors belonging to the first current pathway and the second current pathway and the switch 607 form a signal amplification unit.

The data conversion unit 600 receives the input of 3-bit correction data from the digital assist circuit 500, and converts the lower 2 bits of the correction data into a 3-bit digital signal. In this conversion, when the lower 2 bits of the correction data are "00", they are converted into a 3-bit digital signal of "000". When the lower 2 bits of the correction data are "01", they are converted into a 3-bit digital signal of "001". When the lower 2 bits of the correction data are "10", they are converted into a 3-bit digital signal of "011". When the lower 2 bits of the correction data are "11", they are converted into a 3-bit digital signal of "111". Then, the converted 3-bit digital signal is output to the offset correction unit 700 or 800 according to the highest order bit of the correction data. That is, when the value of the highest order bit of the correction data is "1" (the correction value is a negative value), the converted digital signal is output to the offset correction unit 700 as a digital signal 701. Meanwhile, when the value of the highest order bit of the correction data is "0" (the correction value is a positive value), the converted digital signal is output to the offset correction unit 800 as a digital signal 801. However, when the converted digital signal is output to the offset correction unit 700 as the digital signal 701, a 3-bit digital signal "000" is output to the offset correction unit 800 as a digital signal 801. Meanwhile, when the converted digital signal is output to the offset correction unit 800 as a digital signal 801, a 3-bit digital signal "000" is output to the offset correction unit 700 as a digital signal 701.

The offset correction unit 700 is a circuit to control the cancel current from the first pathway to the ground line through the output terminal from which the output signal OM is output, according to the potential of the digital signal 701 input from the data conversion unit 600 and the node DM.

The offset correction unit 700 includes n units of switches 711, 712, . . . 71n, n units of N-type MOS transistor 721, 722, ... 72n, and n units of switches 731, 732, ... 73n and switches 702, 703. In this embodiment, n is assumed to be 3 or more.

Each of the n units of switches 711, 712, ... 71n is connected to, on one end, the output terminal from which the output signal OM is output, and is connected to, on the other end, the drain of the N-type MOS transistors 721, 722, ... 72n. The source of each the N-type MOS transistors 721, 722, ... 72n are connected to one end of each of the switches 731, 732, ... 73n, and their gate is connected to the node DM. The other end of the switches 731, 732, ... 73n is connected to the ground line. The switch 703 connects or disconnects the output terminal from which the output signal OM is output and the high potential line AVD. The switch 702 connects or disconnects the node DM and the high potential line AVD. Meanwhile, the switches 702, 703 performs the connection or disconnection according to the potential of the clock signal/A. Therefore, before the start of the amplification operation, the output terminal from which the output signal OM is output and the node DM have the same potential as the high potential line AVD. Meanwhile, the output terminal from which the output signal OM is output and the node DM are separated from the high potential line AVD when the amplification operation starts.

The switches 731, 732 ... 73n performs the connection or disconnection according to the potential of the clock signal A. Meanwhile, the clock signal A and the clock signal/A are signals in inverse logic states.

When the n units of switches 711, 712 ... 71n receives a code signal composed of a digital signal of a plurality of bits output from the data conversion unit 600, among the n units, the number of switches corresponding to the binary number expressed by the digital signal enters the connected state, and the other switches are maintained in the disconnected state. Accordingly, when the digital signal is "000", all the switches are in the disconnected state. When the digital signal is "001", one switch enters the connected state. When the digital signal is "011", two switches enter the connected state. When the digital signal is "111", three switches enter the connected state.

Therefore, when the voltage between the output terminal from which the output signal OM is output that is connected through the node DM and the N-type transistor 603 and the output terminal from which the output signal OP is output that is connected through the node DM and the N-type transistor 604, the offset correction unit 700 lets a cancel current flow in the output terminal from which the output signal OM is output, through the N-type MOS transistors 721, 722 ... 72n in the connected state and the switches 711, 712 ..., 71n. The cancel current is a current to correct the offset voltage of the comparator. After the amplification of the voltage, the potential of the node DM becomes approximately the ground level, so the N-type MOS transistors 721, 722 ... 72n are turned off, and the injection of the cancel current is cut off.

The offset correction unit 800 is a circuit to control the cancel current from the second current pathway to the ground line through the output terminal from which the output signal OP is output, according to the potential of the digital signal 801 input from the data conversion unit 600 and the node DP.

The offset correction unit 800 includes n units of switches 811, 812, ... 81n, n units of N-type MOS transistor 821, 822, ... 82n, and n units of switches 831, 832, ... 83n and switches 802, 803. In this embodiment, n is assumed to be 3 or more, as described above.

Each of the n units of switches 811, 812, ... 81n is connected to, on one end, the output terminal from which the output signal OP is output, and is connected to, on the other end, the drain of the N-type MOS transistors 821, 822, ... 82n. The source of each the N-type MOS transistors 821, 822, ... 82n are connected to one end of each of the switches 831, 832, ... 83n, and their gate is connected to the node DP. The other end of the switches 831, 832, ... 83n is connected to the ground line. The switch 803 connects or disconnects the output terminal from which the output signal OP is output and the high potential line AVD. The switch 802 connects or disconnects the node DP and the high potential line AVD. Meanwhile, the switches 802, 803 performs the connection or disconnection according to the potential of the clock signal/A. Therefore, before the start of the amplification operation, the output terminal from which the output signal OP is output and the node DP have the same potential as the high potential line AVD. Meanwhile, the output terminal from which the output signal OP is output and the node DP are separated from the high potential line AVD when the amplification operation starts.

The switches 831, 832 ... 83n performs the connection or disconnection according to the potential of the clock signal A. Meanwhile, the clock signal A and the clock signal/A are signals in inverse logic states.

When the n units of switches 811, 812 ... 81n receives a code signal composed of a digital signal of a plurality of bits output from the data conversion unit 600, among the n units, the number of switches corresponding to the binary number expressed by the digital signal enters the connected state, and the other switches are maintained in the disconnected state. Accordingly, when the digital signal is "000", all the switches are in the disconnected state. When the digital signal is "001", one switch enters the connected state. When the digital signal is "011", two switches enter the connected state. When the digital signal is "111", three switches enter the connected state.

Therefore, in a similar manner as the offset correction unit 700, when the amplification operation starts, the offset correction unit 800 let the cancel current flow in the output terminal from which the output signal OP is output, and cut off the injection of the cancel current after the voltage amplification.

Figure 3:
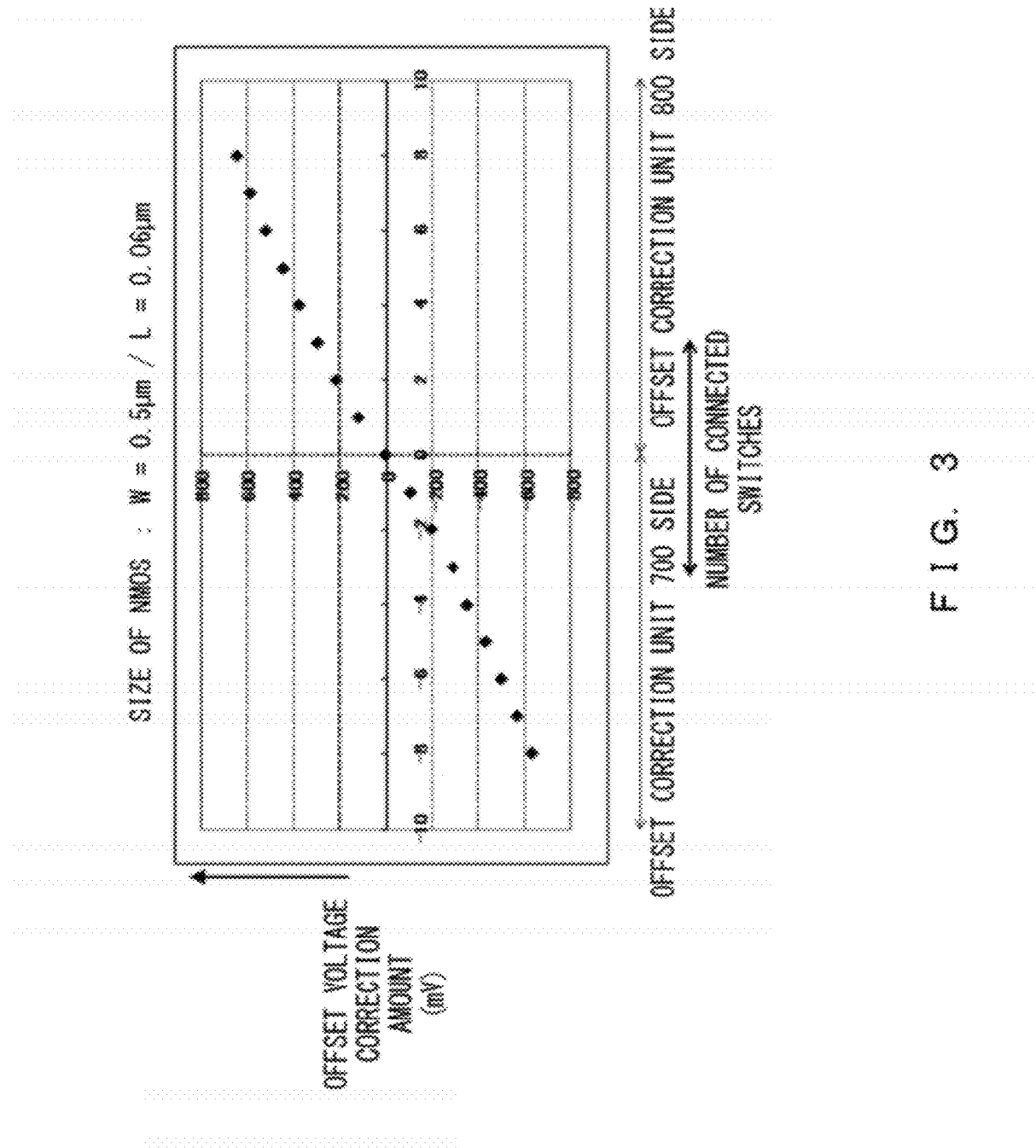
FIG. 3 is a graph illustrating the correction amount of the offset voltage in the offset correction unit with respect to the number of connected switches.

FIG. 3 is a graph illustrating the correction amount of the offset voltage in the offset correction units 700, 800 with respect to the number of connected switches.

In the graph illustrated in FIG. 3, the positive direction on the horizontal axis indicates the number of connected switches in the n units of switches 811, 812 ... 81n of the offset correction unit 800. Meanwhile, the negative direction on the horizontal axis indicates the number of connected switches in the n units of switches 711, 712 ... 71n of the offset correction unit 700.

The size of the N-type MOS transistor connected by the switch is, for example, W=0.5 μm, L=0.06 μm.

The vertical axis indicates the potential change of the output signal OM as the correction amount (mV) of the offset voltage with respect to the number of connected switches.

That is to say, the potential of the output signal OM decreases by 100 mV compared with the potential of the original output signal OM every time when a switch to be connected among the n units of switches 711, 712, ... 71n of the offset correction unit 700 is connected. Meanwhile, the potential of the output signal OM increases by 100 mV relatively compared with the potential of the output signal OP every time when a switch to be connected among the n units of switches 811, 812, ... 81n of the offset correction unit 800 is connected.

The reason why the potential of the output signal OM changes according to release/closure of switches is as follows. First, in the n units of switches 711, 712 ..., 71n of the offset correction unit 700, when a switch is connected, the current flowing in the P-type MOS transistor 601 increases by a certain amount. As a result, the voltage decrease amount on the drain side by the on resistance of the P-type MOS transistor 601 increases by a certain amount. Then, since the signal line in which the output signal OM propagates is connected to the drain side, it is understood that, by obtaining the voltage decrease amount by simulation in a case when, for example, the size of the N-type MOS transistor connected to the signal line in which the output signal OM propagates is W=0.5 µm and L=0.06 µm every time when a switch is connected, the potential of the output signal OM decreases by 100 mV.

Thinking in the same way, in the n units of switches 811, 812 ..., 81n of the offset correction unit 800, when a switch is connected, the current flowing in the P-type MOS transistor 602 increases by a certain amount. As a result, the voltage decrease amount on the drain side by the on resistance of the P-type MOS transistor 602 increases by a certain amount. Then, since the signal line in which the output signal OP propagates is connected to the drain side, it is understood that, by obtaining the voltage decrease amount by simulation in a case when, for example, the size of the N-type MOS transistor connected to the signal line in which the output signal OP propagates is W=0.5 µm and L=0.06 µm every time when a switch is connected, the potential of the output signal OM decreases by 100 mV. As a result, relatively, the potential of the output signal OM with respect to the potential of the output signal OP increases.

In a comparator having such a configuration, correction of the offset voltage refers to performing control so that, when the same potential is given to the input signals VIP and VIM, the output signals OM and OP have approximately same potential, with correction data. That is, it refers to performing control of the number of connected switches among the n units of switches 711, 712 ... 71n, of the offset correction unit 700 or the n units of switches 811, 812 ... 81n of the offset correction unit 800 in order to create the above state.

Figure 4:
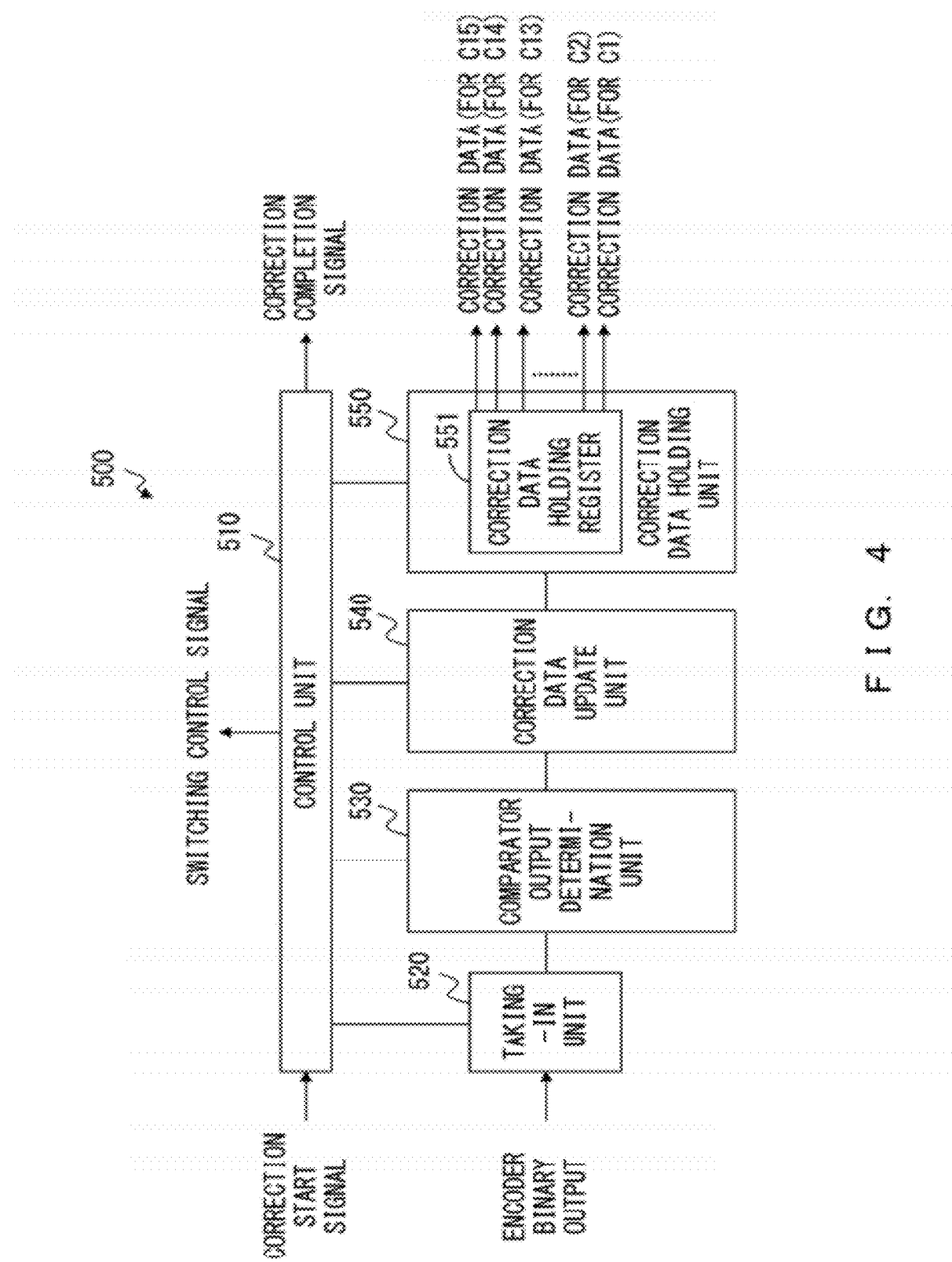
FIG. 4 is a diagram illustrating a configuration example of a digital assist circuit included in an ADC being an analog-to-digital conversion apparatus according to embodiment 1.
Figure 5:
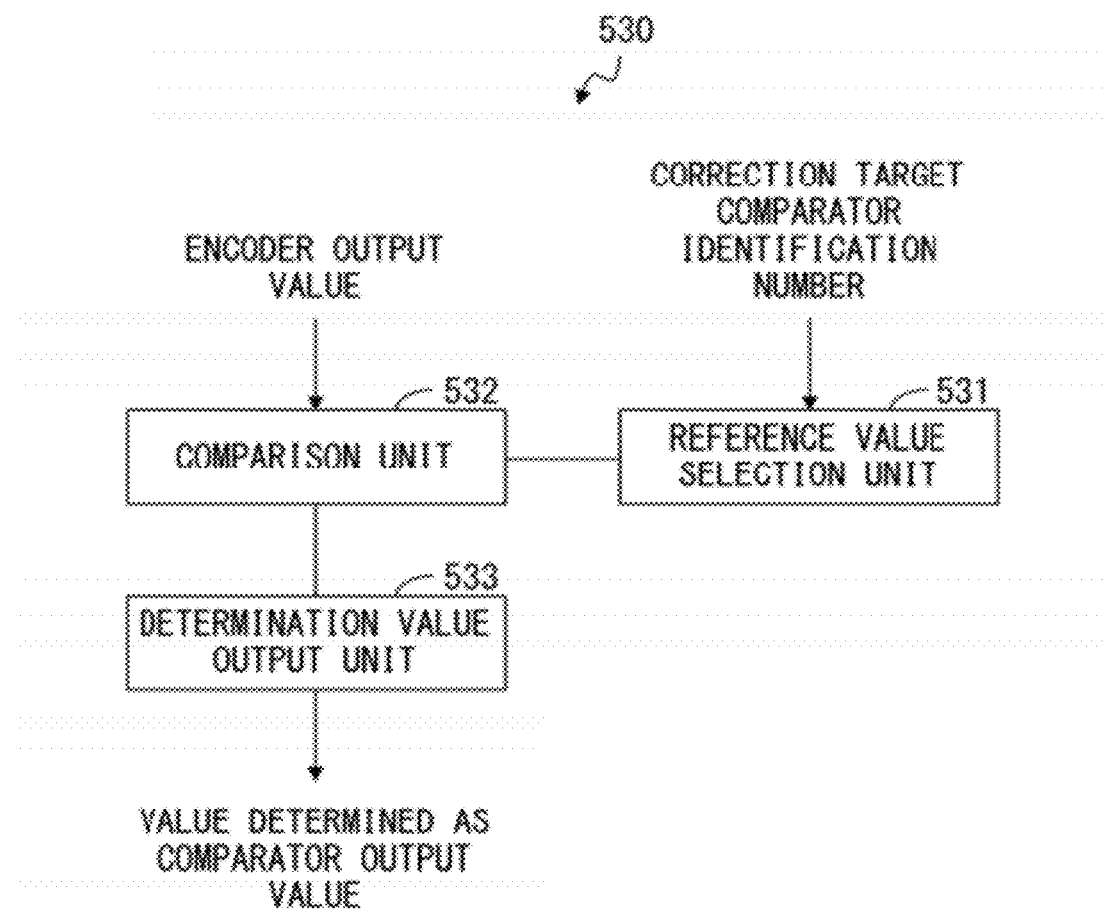
FIG. 5 is a diagram illustrating a configuration example of a comparator output determination unit included in a digital assist circuit.

FIG. 4 is a diagram illustrating a configuration example of the digital assist circuit 500. FIG. 5 is a diagram illustrating a configuration example of a comparator output determination unit included in the digital assist circuit 500.

As illustrated in FIG. 4, the digital assist circuit 500 includes a control unit 510, a taking-in unit 520, a comparator output determination unit 530, a correction data update unit 540, and a correction data holding unit 550.

Here, the control unit 510 is an example of a control unit. The comparator output determination unit 530 is an example of a determination unit. The correction data update unit 540 is an example of an update unit. The correction data holding unit 550 is an example of a storage unit.

The control unit 510 controls the overall operation of the digital assist circuit 500, and also controls the switch unit 200. Meanwhile, the control of the switch unit 200 is performed by outputting a switching control signal to the switch unit 200. In addition, the control unit 510 performs, when a correction start signal is input from a control unit of a higher plane provided in the ADC according to the present embodiment not illustrated in the drawing, a control operation to correct the offset voltage for each of the 15 comparators C1 through C15. Meanwhile, during this operation, when a change notification signal is input from the correction data update unit 540, the control unit 510 changes the comparator being the target of the correction. Then, when the control operation is completed, it outputs a correction completion signal to the control unit of a higher plane.

The taking-in unit 520 takes in the output signal of the encoder 400 in synchronization with the operation clock of the digital assist circuit 500, and outputs it to the comparator output determination unit 530.

The comparator output determination unit 530 includes, as illustrated in FIG. 5, a reference value selection unit 531, a comparison unit 532, and a determined value output unit 533.

The reference value selection unit 531 outputs a corresponding reference value according to the correction target comparator identification number input from the control unit 510. The correction target comparator identification number is an identification number of a comparator being the correction target. For example, the reference value selection unit 531 outputs "15" as the reference value when the comparator identification number is "C15". It outputs "14" as the reference value when the comparator identification number is "C14". It outputs "13" as the reference value when the comparator identification number is "C13". It outputs "12" as the reference value when the comparator identification number is "C12. It outputs "11" as the reference value when the comparator identification number is "C11". It outputs "10" as the reference value when the comparator identification number is "C10". It outputs "9" as the reference value when the comparator identification number is "C9. It outputs "8" as the reference value when the comparator identification number is "C8. It outputs "7" as the reference value when the comparator identification number is "C7". It outputs "6" as the reference value when the comparator identification number is "C6". It outputs "5" as the reference value when the comparator identification number is "C5". It outputs "4" as the reference value when the comparator identification number is "C4". It outputs "3" as the reference value when the comparator identification number is "C3". It outputs "2" as the reference value when the comparator identification number is "C2". It outputs "1" as the reference value when the comparator identification number is "C1".

The comparison unit 532 compares whether or not the value of the output signal of the encoder 400 that was taken in by the taking-in unit 520 is smaller than the reference value input from the reference value selection unit 530, and outputs the comparison result to the determined value output unit 533.

The determined value output unit 533 outputs, according to the comparison result of the comparison unit 532, "0" when the value of the output signal of the encoder 400 is smaller than the reference value, and "1" otherwise. The output value of the determined value output unit 533 is a value determined as the comparison result (output value) of the comparator being the correction target.

In FIG. 4, the correction data update unit 540 reads out correction data for the comparator of the correction target comparator identification number input from the control unit 510 from a correction data holding register 551 of the correction data holding unit 550. Then, based on the read out correction data and the output value of the determined value output unit 533, it generates the latest correction data for the comparator of the correction target comparator identification number as follows. That is, when the output value of the determined value output unit 533 is "0", the correction data update unit 540 generates a value obtained by subtracting 1 from the value of the correction data read out from the correction data holding register 551 as the latest correction data. On the other hand, when the output value of the determined value output unit 533 is "1, the correction data update unit 540 generates a value obtained by adding 1 to the value of the correction data read out from the correction data holding register 551 as the latest correction data. After generating the latest correction data, the correction data update unit 540 updates the correction data for the comparator of the correction target comparator identification number stored in the correction data holding register 551 to the generated most updated correction data.

In addition, the correction data update unit 540 holds the output value of the comparator output determination unit 530 (determined value output unit 533) obtained first during the correction operation of the offset voltage for the comparator of the correction target comparator identification number. Then, it performs comparison with an output value from of the comparator output determination unit 530 obtained later during the correction operation, and judges whether or not the output value obtained later has changed with respect to the output value obtained first. When the output value obtained later has changed according to the judgment, a change notification signal is output to the control unit 510. When the change notification signal is input, the control unit 510 changes the correction target comparator as described above.

The correction data holding unit 550 includes the correction data holding register 551. The correction data holding register 551 stores correction data for each of the comparators C1 through C15. In addition, the correction data holding unit 550 outputs the correction data for each of the comparators C1 through C15 stored in the correction data holding register 551 to the comparators C1 through C15 at the time of the normal operation and at the time of the offset correction operation. Meanwhile, in each of the signal lines between the correction data holding unit 550 and the comparators C1 through C15, 3-bit data being the correction data is transferred in the parallel manner.

Next, the operation of the ADC according to the present embodiment is explained.

The ADC according to the present embodiment is capable of performing, other than the analog-to-digital conversion operation as the normal operation, the offset correction operation, as described above. Then, here, the offset correction operation is explained as the operation of the ADC.

However, in the ADC according to the present embodiment, the value of the offset voltage generated in each of the comparators C1 through C15 is assumed to be smaller than the voltage value corresponding to 1LSB (Least Significant Bit) of the digital signal being the output of the encoder 400. Hereinafter, the voltage value corresponding to 1LSB is simply referred to as the voltage value corresponding to 1LSB.

In addition, in the ADC according to the present embodiment, the correction amount range in which the offset voltage can be corrected by correction data is assumed as the range of the voltage value corresponding to ±1LSB.

Figure 6:
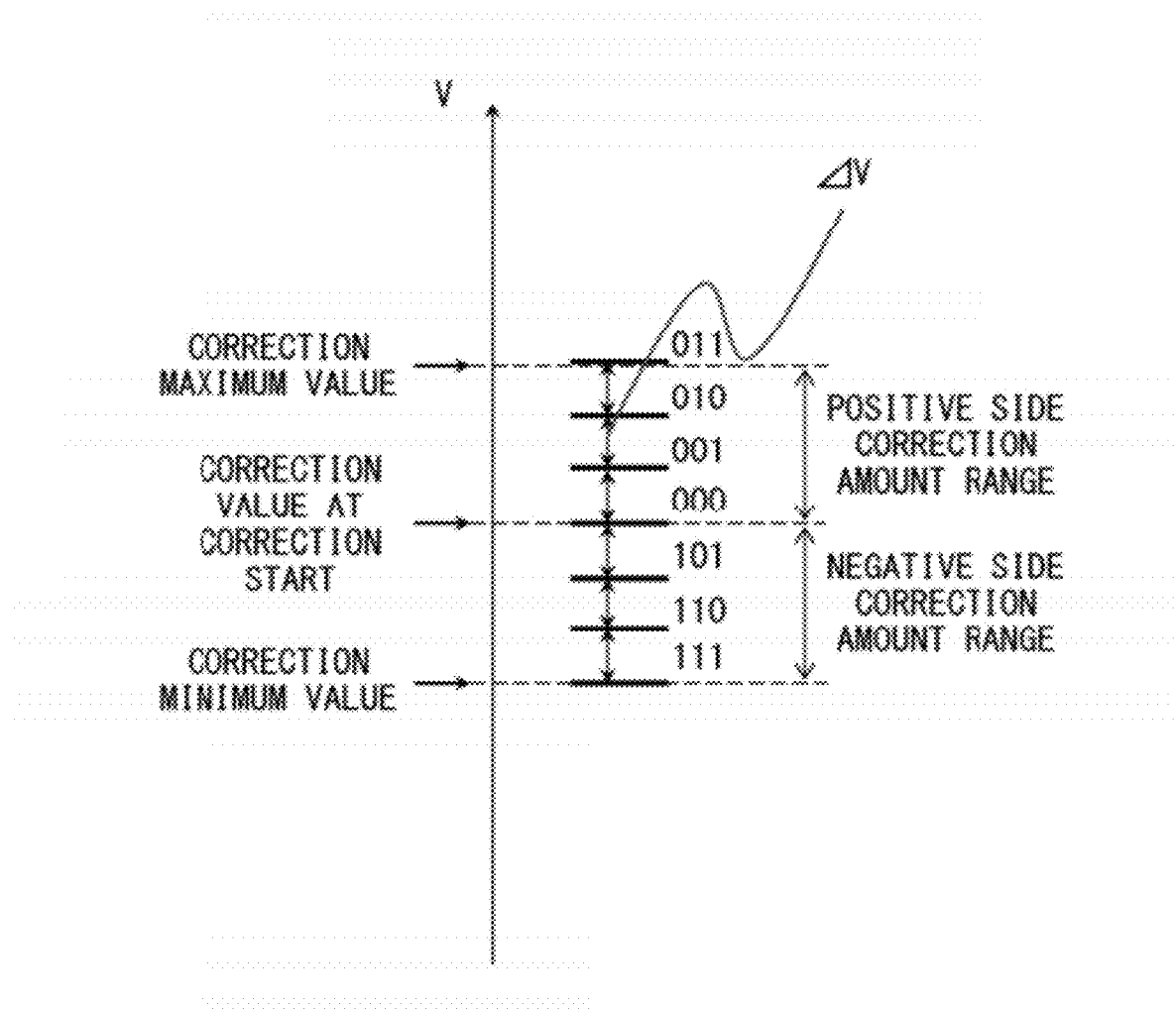
FIG. 6 is a diagram illustrating a correction amount range in which the offset voltage can be corrected by correction data in an ADC being an analog-to-digital conversion apparatus according to embodiment 1.

FIG. 6 is a diagram illustrating the correction amount range.

As illustrated in FIG. 6, in the ADC according to the present embodiment, correction in three stages respectively on the positive side and the negative side. i.e., correction in seven stages in total can be performed.

In FIG. 6, the range between the correction amount by correction data "000" indicating the correction value "0" at the time of the offset correction operation start and the correction amount by correction data "011" indicating the maximum value "+3" of the correction value is the correction amount range on the positive side. Meanwhile, the range between the correction amount by correction data "000" indicating the correction value "0" at the time of the offset correction operation start and the correction amount by correction data "111" indicating the minimum value "−3" of the correction value is the correction amount range on the negative side. Then, the range combining the correction amount ranges on the positive side and the negative side is the range of the voltage value corresponding to ±1LSB. Meanwhile, in FIG. 6, ΔV is the amount of change of the correction amount when the correction value changes by 1.

Figure 7:
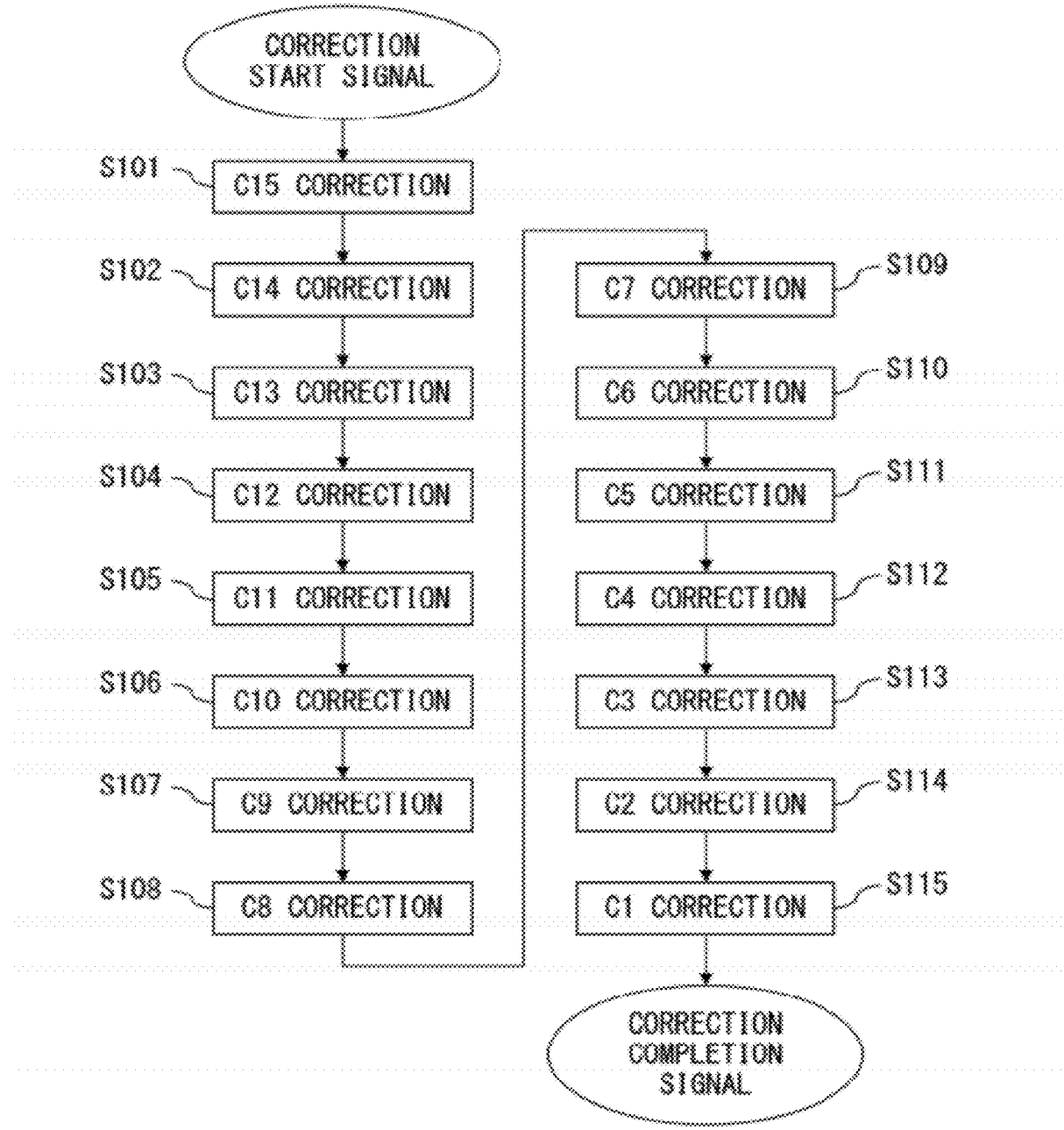
FIG. 7 is a flowchart illustrating an offset correction operation of an ADC being an analog-to-digital conversion apparatus according to embodiment 1.

FIG. 7 is a flowchart illustrating the offset correction operation.

As illustrated in FIG. 7, the offset correction operation starts when a correction start signal is input from a control unit of a higher plane provided in the ADC according to the present embodiment and not illustrated in the drawing to the control unit 510 of the digital assist circuit 500.

When the offset correction operation starts, first, the correction data holding unit 550 clears correction data for each of the comparators C1 through C15 stored in the correction data holding register 551. Accordingly, in the correction data holding register 551, 3-bit data of "000" is stored as correction data for each of the comparators C1 through C15, and the correction data is output from the correction data holding unit 550 to the comparators C1 through C15.

Next, in the order of the comparators C15 to the C1, the operation to correct the offset voltage is performed for each of the comparators C1 through C15 (S101 through S115). Meanwhile, in each of S101 through S115, in the comparator being the correction target, the switching of the switch unit 200 is controlled so that the reference voltage input from the ladder resistance unit 100 through the switch unit 200 becomes the same potential as that of the reference voltage input directly from the ladder resistance unit 100.

When S101 through S115 are completed, the control unit 510 controls the switching of the switch unit 200 so that the signal input from the switch unit 200 to the comparator unit 300 becomes an analog input signal (ADC_in), and outputs a correction completion signal to the control unit of a higher plane.

Then, when the correction completion signal is input to the control unit of a higher plane from the control unit, the ADC according to the present embodiment shifts to the normal operation.

In the offset correction operation performed as described above, in each of S101 through S115 mentioned above, basically a similar operation is performed. Therefore, the operation in S101 is described in detail representatively here, and description for the operation in the other S102 through S115 is omitted.

Figure 8:
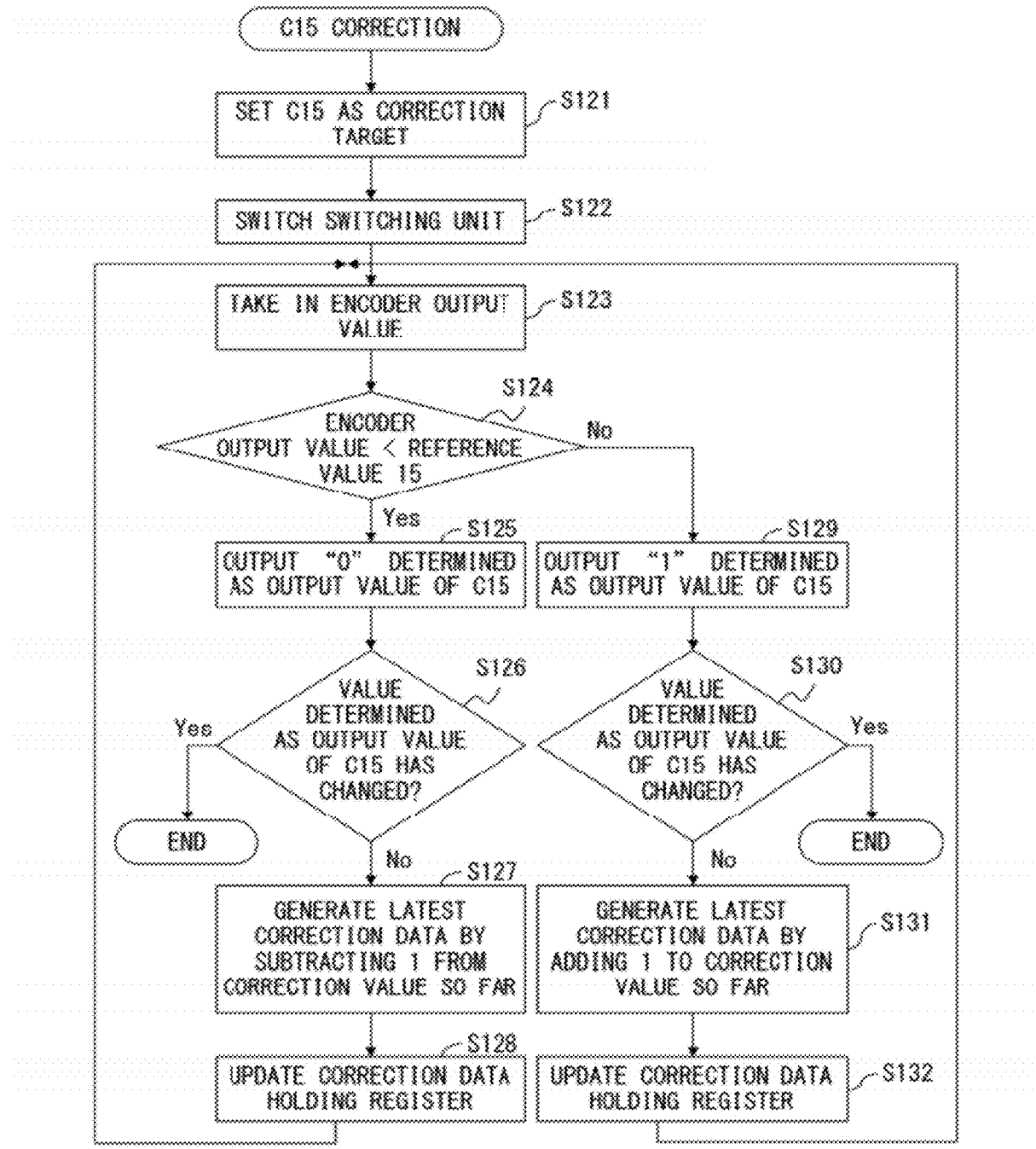
FIG. 8 is a flowchart illustrating the operation in S101.

FIG. 8 is a flowchart illustrating the operation in S101.

As illustrated in FIG. 8, in this operation, first, the control unit 510 sets the correction target comparator identification number as "C15" (S121). Accordingly, the comparator C15 is set as the comparator being the correction target.

Next, the control unit 510 controls the switching of the switching unit 200 so that the reference voltage input from the ladder resistance unit 100 to the comparator C15 through the switching unit 200 has the same potential as the reference voltage input from the ladder resistance unit directly to the comparator C15 (S122). Accordingly, in the comparator C15, the ladder reference Vref_lad15 input directly from the ladder resistance unit 100 and the reference voltage Vref_lad15 input from the ladder resistance unit 100 through the switching unit 200 are compared. In addition, in the comparator unit 300, each of the reference voltages Vred_lad1 through Vref_lad15 input directly from the ladder resistance unit 100 and the reference voltage Vref_lad15 input through the switch unit 200 are compared in a parallel manner. Then, the comparison result in the comparator unit 300, that is, the comparison result of the comparators C1 through C15 is converted in to a 4-bit digital signal by the encoder 400.

Next, the taking-in unit 530 takes in the output signal (output value) of the encoder 400 in synchronization with the operation clock of the digital assist circuit 500, and outputs it to the comparator output determination unit 530 (comparison unit 532) (S123).

Next, in the comparator output determination unit 530, the reference value selection unit 531 selects the reference value "15" according to the correction target comparator identification number "C15", and outputs it to the comparison unit 532. The comparison unit 532 compares whether or not the value of the output signal of the encoder 400 input from the taking-in unit 520 is smaller than the reference value "15" input from the comparison unit 532 (S124). Then, the comparison result is output to the determined value output unit 533.

If the value of the output signal of the encoder 400 is smaller than the reference value according to the comparison result of the comparison unit 532 (Yes in S124), the determined value output unit 533 outputs the value "0" determined as the output value of the comparator C15 (S125). On the other hand, if not (No in S124), the value "1" determined as the output value of the comparator C15 is output (S129).

After S125, the correction data update unit 540 compares the output value "0" of the determined value output unit 533 at this time and the output value of the determined value output unit 533 obtained first after the start of the operation in S101 (S126). However, if the output value "0" at this time is the output value of the determined value output unit 533 obtained first after the start of the operation in S101, the comparison in S126 is not performed. Instead, the correction data update unit 540 holds the output value "0" at this time as the output value of the determined value output unit 533 obtained first after the start of the operation in S101.

In the judgment in S126, if the judgment result is Yes, the correction data update unit 540 outputs a change notification signal to the control unit 510. When the change notification signal is input to the control unit 510, the operation in S101 is terminated and shift to the operation in S102 is performed.

On the other hand, if the judgment result in S126 is No, the correction data update unit 540 reads out correction data for the comparator of the correction target comparator identification number "C15" input from the control unit 510, from the correction data holding register 551. Then, a value in which 1 is subtracted from the value of the readout correction data is generated as the latest correction data (S127). In addition, the correction data update unit 540 updates the correction data for the comparator of the correction target comparator identification number "C15" stored in the correction data holding resister 551 to the latest correction data generated in S127 (S128). Accordingly, until the next update is performed, the latest correction data is output to the comparator C15 as the correction data for the comparator C15.

Meanwhile, after S129, the correction data update unit 540 compares the output value "1" of the determined value output unit 533 at this time and the output value of the determined value output unit 533 obtained first after the start of the operation in S101 (S130). However, if the output value "1" at this time is the output value of the determined value output unit 533 obtained first after the start of the operation in S101, the comparison in S130 is not performed. Instead, the correction data update unit 540 holds the output value "1" at this time as the output value of the determined value output unit 533 obtained first after the start of the operation in S101.

In the judgment in S130, if the judgment result is Yes, the correction data update unit 540 outputs a change notification signal to the control unit 510. When the change notification signal is input to the control unit 510, the operation in S101 is terminated and shift to the operation in S102 is performed.

On the other hand, if the judgment result in S130 is No, the correction data update unit 540 reads out correction data for the comparator of the correction target comparator identification number "C15" input from the control unit 510, from the correction data holding register 551. Then, a value in which 1 is added to the value of the read out correction data is generated as the latest correction data (S131). In addition, the correction data update unit 540 updates the correction data for the comparator of the correction target comparator identification number "C15" stored in the correction data holding resister 551 to the latest correction data generated in S131 (S132). Accordingly, until the next update is performed, the latest correction data is output to the comparator C15 as the correction data for the comparator C15.

After S128 or S132, return to S123 is performed, and after that, the operations described above are repeated until the output value of the determined value output value changes. That is, if the output value of the determined value output unit 533 is "0" first, the operations described above are repeated until the output value becomes "1" (until S130 results in Yes) afterwards. On the other hand, if the output value of the determined value output unit 533 is "1" first, the operations described above are repeated until the output value becomes "0" (until S126 results in Yes) afterwards.

According the operation in S101 as described above, the offset voltage generated in the comparator C15 is corrected.

Figure 9B:
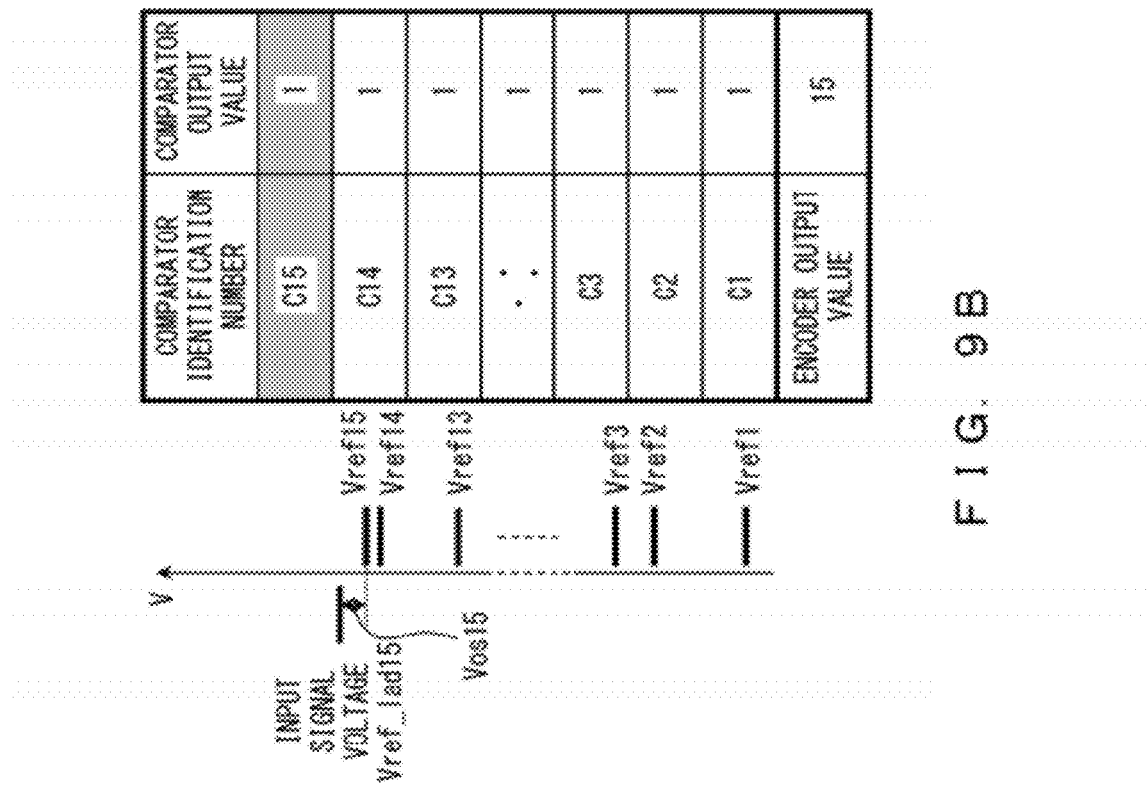
FIG. 9A, B are diagrams illustrating operation examples in S101.
Figure 9A:
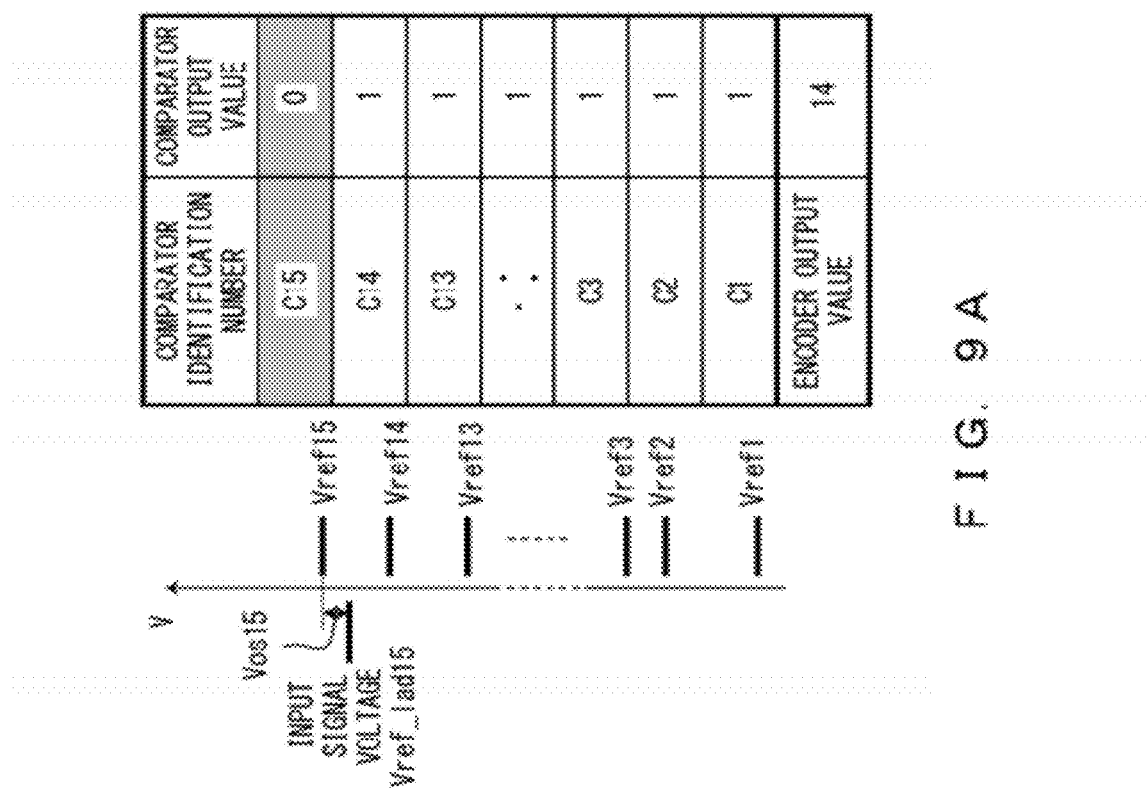

FIGS. 9A, 9B are diagrams illustrating operation examples of S101.

FIG. 9A is a diagram illustrating a case in which an offset voltage $V_{OS}15$ is generated with which, when the switch unit 200 is switched so that the input signal voltage has the same potential as the reference voltage in the comparator C15, the potential of the input signal voltage becomes lower than that of the reference voltage. FIG. 9B is a diagram illustrating a case in which an offset voltage $V_{OS}15$ is generated with which, when the switch unit 200 is switched so that the input signal voltage has the same potential as the reference voltage in the comparator C15, the potential of the input signal voltage becomes higher than that of the reference voltage.

Here, the input signal voltage is the reference voltage Vref_lad15 input from the ladder resistance unit 100 to the comparator C15 through the switch unit 200, which is presented as it is as Vref_lad15 in FIGS. 9A, 9B. Meanwhile, the reference voltage is the reference voltage Vref_lad15 input from the ladder resistance unit 100 directly to the comparator C15, which is presented simply as Vref15 in FIGS. 9A, 9B. In addition, in FIGS. 9A, 9B, the other reference voltages Vref_lad1 through Vref_lad14 input from the ladder resistance unit 100 directly to the comparator unit 300 are presented simply as Vref1 through Vref14.

Meanwhile, as described above, correction of the offset voltage generated in the comparator refers to performing control so that, when the same potential is given to the input signals VIP and VIM, the output signals OM and OP have approximately same potential, with correction data. However, here, for the sake of convenience of explanation, performance of such control is schematically presented as performance of control so that the reference voltage has approximately the same potential as the input signal voltage.

In the example illustrated in FIG. 9A, since the input signal voltage Vref_lad15 has a lower potential than that of the reference voltage Vref15 in the comparator C15, the output value of the comparator C15 becomes "0". On the other hand, since the input signal voltage Vref_lad15 has a higher potential than that of each of the reference voltages Vref1 through Vref14 in the other comparators C1 through C14, the output value becomes "1". As a result, the output value of the encoder 400 becomes "14".

Then, in the comparator output determination unit 530, the output value "14" of the encoder 400 and the reference value "15" corresponding to the correction target comparator identification number "C15" are compared. In this case, since the output value "14" of the encoder 400 is smaller than the reference value "15", the output value of the comparator output determination unit 530 becomes "0". As a result, in the correction data update unit 540, a value in which 1 is subtracted from the value of the correction data for the comparator C15 read out from the correction data holding register 551 is generated as the latest correction data. Then, the correction data for the comparator C15 stored in the correction data holding register 551 is updated to the latest correction data.

The correction of the offset value for the comparator C15 is performed by repeating the operation as described above until the output value of the comparator output determination unit 530 changes, that is, until its output value becomes "1".

Meanwhile, change of the output value of the comparator output determination unit 530 means that the magnitude relation of the potentials of the reference value and the input signal voltage is inverted. When the magnitude relation of the potentials is inverted, since it can be regarded that the reference voltage has approximately the same voltage as the input signal voltage, the correction for the comparator C15 is terminated.

On the other hand, in the example illustrated in FIG. 9B, since the input signal voltage Vref_lad15 has a higher potential than that of the reference voltage Vref15 in the comparator C15, the output value of the comparator C15 becomes "1". In addition, since the input signal voltage Vref_lad15 also has a higher potential than that of each of the reference voltages Vref1 through Vref14 in the other comparators C1 through C14, the output value becomes "1". As a result, the output value of the encoder 400 becomes "15".

Then, in the comparator output determination unit 530, the output value "15" of the encoder 400 and the reference value "15" corresponding to the correction target comparator identification number "C15" are compared. In this case, since the output value "15" of the encoder 400 is not smaller than the reference value "15", the output value of the comparator output determination unit 530 becomes "1". As a result, in the correction data update unit 540, a value in which 1 is added to the value of the correction data for the comparator C15 read out from the correction data holding register 551 is generated as the latest correction data. Then, the correction data for the comparator C15 stored in the correction data holding register 551 is updated to the latest correction data.

The correction of the offset value for the comparator C15 is performed by repeating the operation as described above until the output value of the comparator output determination unit 530 changes, that is, until its output value becomes "0".

Figure 10B:
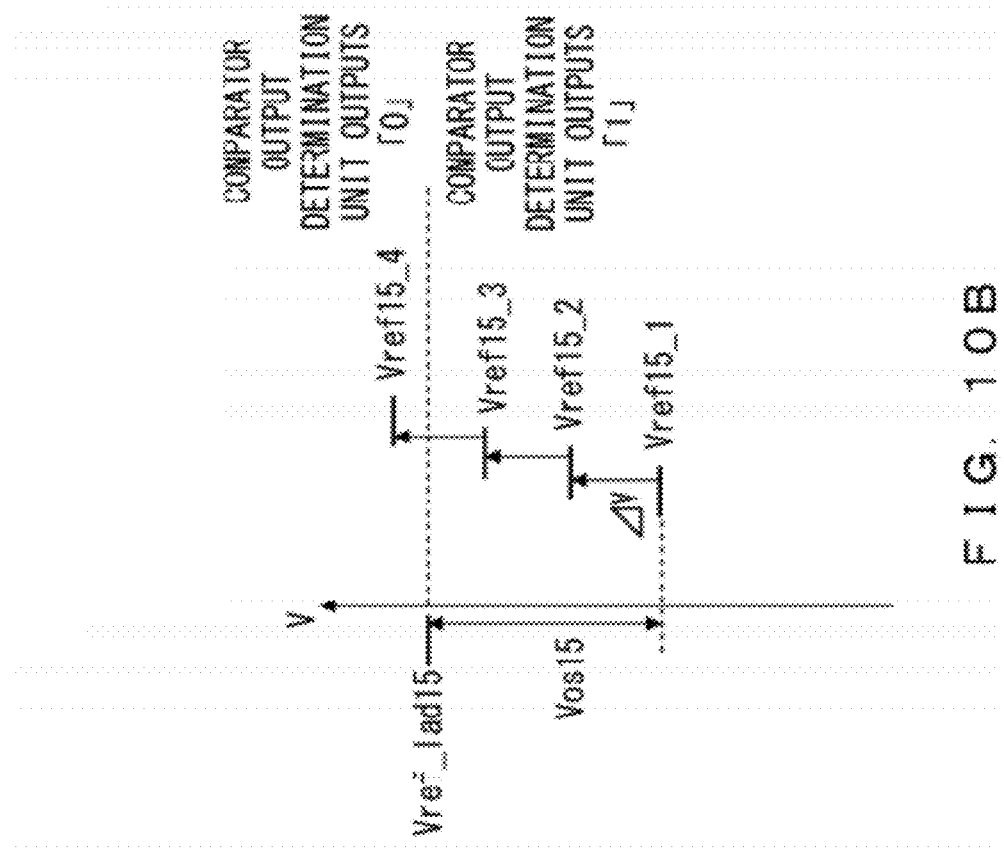
FIGS. 10A, B are diagrams illustrating an example of the way in which the offset voltage generated in a comparator C15 is corrected gradually.
Figure 10A:
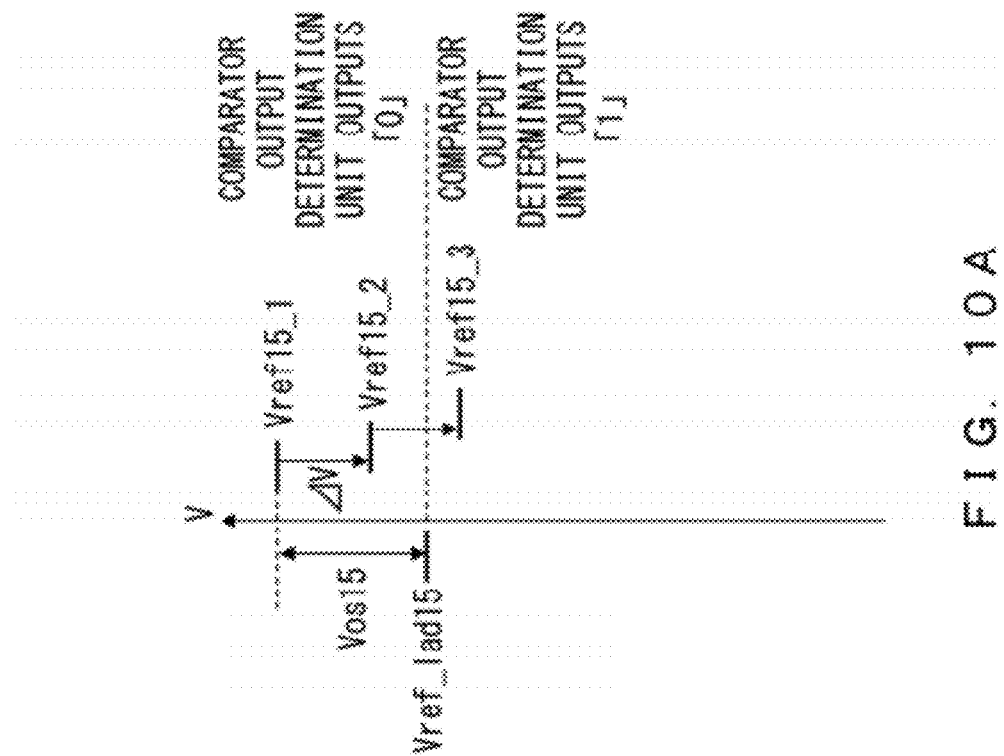

FIGS. 10A, 10B are diagrams illustrating an example of the way in which the offset voltage generated in the comparator C15 is corrected gradually.

FIG. 10A is a diagram illustrating an example of the way of correction in an example such as the one illustrated in FIG. 9A. FIG. 10B is a diagram illustrating an example of the way of correction in an example such as the one illustrated in FIG. 9B.

The example illustrated in FIG. 10A is an example of a case when, in the operation in S101, first, an offset voltage $V_{OS}15$ is generated with which the potential of the input signal voltage is lower than that of the reference voltage. Meanwhile, the reference voltage at this time is Vref15_1 in FIG. 10A. The input signal voltage is Vref_lad15 in FIG. 10A. In this case, in the first operation of S123 through S132 illustrated in FIG. 8, the output value of the comparator output determination unit 530 becomes "0". Therefore, the correction data for the comparator C15 stored in the correction data holding register 551 is updated from "000" to "101", and is output to the comparator C15. Accordingly, the offset voltage generated in the comparator C15 becomes $V_{OS}15-\Delta V$. Meanwhile, the reference voltage at this time is Vref15_2 in FIG. 10A. At this time also, since the potential of the input signal voltage is lower than that of the reference voltage, in the second operation of S123 through S132 illustrated in FIG. 8, the output value of the comparator output determination unit 530 becomes "0". Therefore, the correction data for the comparator C15 stored in the correction data holding register 551 is further updated from "101" to "110", and is output to the comparator C15. Accordingly, the offset voltage generated in the comparator C15 becomes $V_{OS}15-2\Delta V$. Meanwhile, the reference voltage at this time is Vref15_3 in FIG. 10A. At this time, since the potential of the input signal voltage is higher than that of the reference voltage, in the third operation of S123 through S132 illustrated in FIG. 8, the output value of the comparator output determination unit 530 becomes "1". Therefore, since it means that the output value of the comparator output determination unit 530 has changed from "0" originally to "1", the operation of S101 is terminated at this point of time. In the other words, the correction operation of the offset voltage for the comparator C15 is terminated.

Meanwhile, the example illustrated in FIG. 10B is an example of a case when, in the operation in S101, first, an offset voltage $V_{OS}15$ is generated with which the potential of the input signal voltage is higher than that of the reference voltage. Meanwhile, the reference voltage at this time is Vref15_1 in FIG. 10B. The input signal voltage is Vref_lad15 in FIG. 10B. In this case, in the first operation of S123 through S132 illustrated in FIG. 8, the output value of the comparator output determination unit 530 becomes "1". Therefore, the correction data for the comparator C15 stored in the correction data holding register 551 is updated from "000" to "001", and is output to the comparator C15. Accordingly, the offset voltage generated in the comparator C15 becomes $V_{OS}15-\Delta V$. Meanwhile, the reference voltage at this time is Vref15_2 in FIG. 10B. At this time also, since the potential of the input signal voltage is higher than that of the reference voltage, in the second operation of S123 through S132 illustrated in FIG. 8, the output value of the comparator output determination unit 530 becomes "1". Therefore, the correction data for the comparator C15 stored in the correction data holding register 551 is further updated from "001" to "010", and is output to the comparator C15. Accordingly, the offset voltage generated in the comparator C15 becomes $V_{OS}15-2\Delta V$. Meanwhile, the reference voltage at this time is Vref15_3 in FIG. 10B. At this time also, since the potential of the input signal voltage is higher than that of the reference voltage, in the third operation of S123 through S132 illustrated in FIG. 8, the output value of the comparator output determination unit 530 becomes "1". Therefore, the correction data for the comparator C15 stored in the correction data holding register 551 is further updated from "010" to "011", and is output to the comparator C15. Accordingly, the offset voltage generated in the comparator C15 becomes $V_{OS}15-3\Delta V$. Meanwhile, the reference voltage at this time is Vref15_4 in FIG. 10B. At this time, since the potential of the input signal voltage is lower than that of the reference voltage, in the fourth operation of S123 through S132 illustrated in FIG. 8, the output value of the comparator output determination unit 530 becomes "0". Therefore, since it means that the output value of the comparator output determination unit 530 has changed from "1" originally to "0", the operation of S101 is terminated at this point of time. In the other words, the correction operation of the offset voltage for the comparator C15 is terminated.

The operation as described above is performed in a similar way in each of following S102 through S115, performing the correction of the offset voltage for each of the comparators C1 through C14.

As described above, according to the ADC according to the present embodiment, the operation to correct the offset voltage for each of the comparators C1 through C15 can be performed based on the output signal of the encoder 400. In addition, in the offset correction operation, the value to be the output value of the comparator can be determined based on the output signal of the encoder 400. Therefore, there is no need to place any signal line between each of the comparators C1 through C15 and the digital assist circuit 500, and only a signal line between the output of the encoder 400 and the digital assist circuit 500 is needed to be placed, making it possible to reduce the number of lines. Accordingly, crowding of the circuit can be relieved.

Meanwhile, the ADC according to the present embodiment is effective in the case of changing design to increase the number of bits of the digital signal obtained by the analog-to-digital conversion. That is, while about twice the number of comparators are required every time the number of bits increases by 1, the number of output signal lines of the encoder increases only by 1, so the number of the signal lines between the output of the encoder and the digital assist circuit 500 needs to be increased only by 1. Therefore, in such a case, crowding of the circuit due to increase in signal lines can be relieved.

In addition, in the ADC according to the present embodiment, as described above, since any signal line between the output of each of the comparators C1 through C15 and the digital assist circuit 500 is not needed, the electric load at the output destination of each comparator does not increase. Therefore, it is effective for speeding up the analog-to-digital conversion process.

Meanwhile, the ADC may be modified in various ways.

For example, the offset correction operation described above may be modified to reverse the order of comparators to be the target of offset voltage correction.

Figure 11:
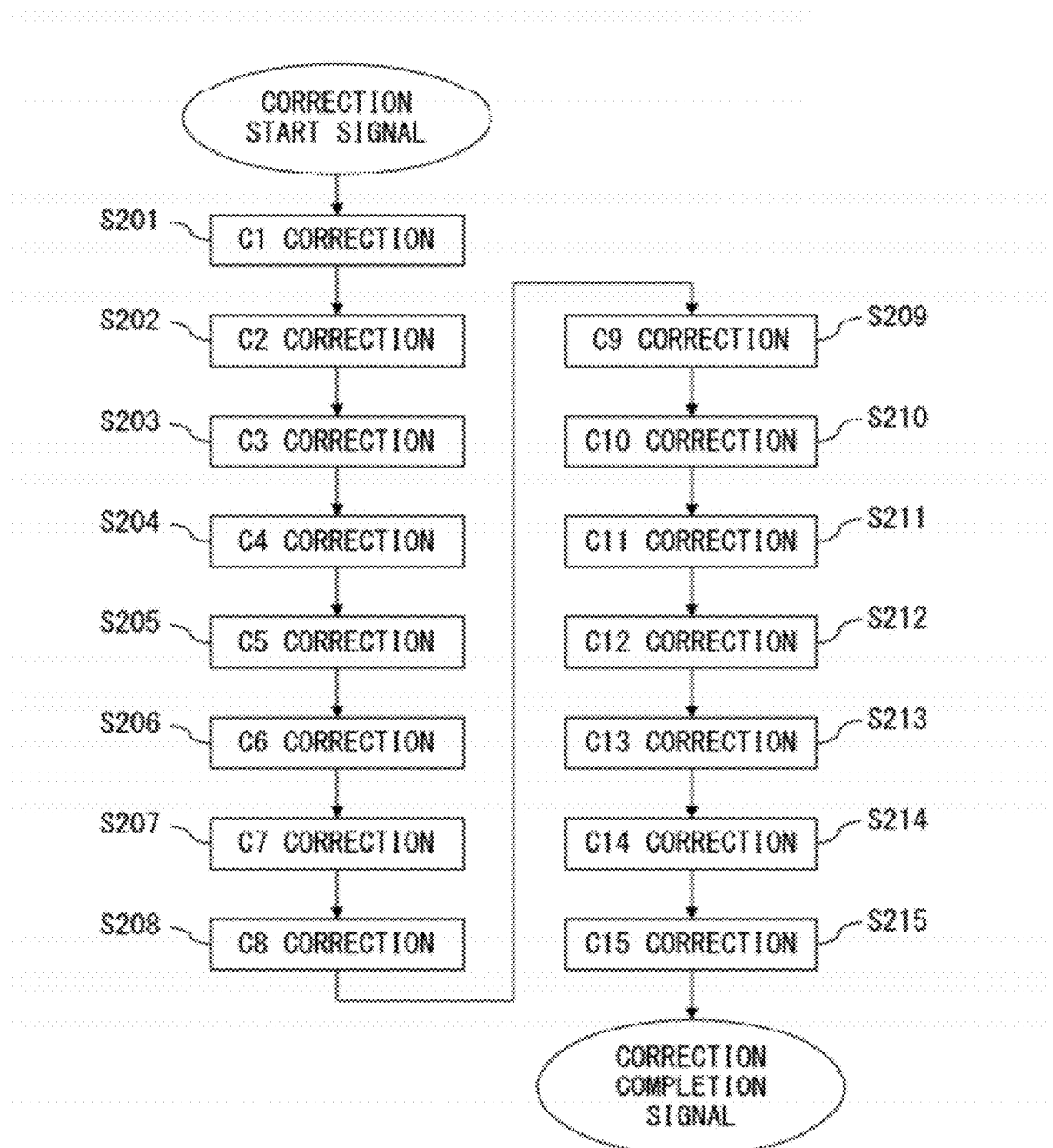
FIG. 11 is a flowchart illustrating an offset correction operation according to a variation example of an ADC being an analog-to-digital conversion apparatus according to embodiment 1.

FIG. 11 is a flowchart illustrating the offset correction operation according to such a modification example.

As illustrated in FIG. 11, in this operation, the operation to correct the offset voltage is performed for each of the comparators C1 through C15 in the order from the comparator C1 to the comparator C15 (S201 through S215). Operations in other parts are the same as in the offset correction operation described above.

In S201 through S215, S101 through S115 presented in FIG. 7 mentioned above performed simply in the reverse order, so each of S201 through S215 is basically the same operation as each of S101 through S115. Therefore, only the operation in S201 is described in detail representatively here, and explanation for the operation in the other S202 through S215 is omitted.

Figure 12:
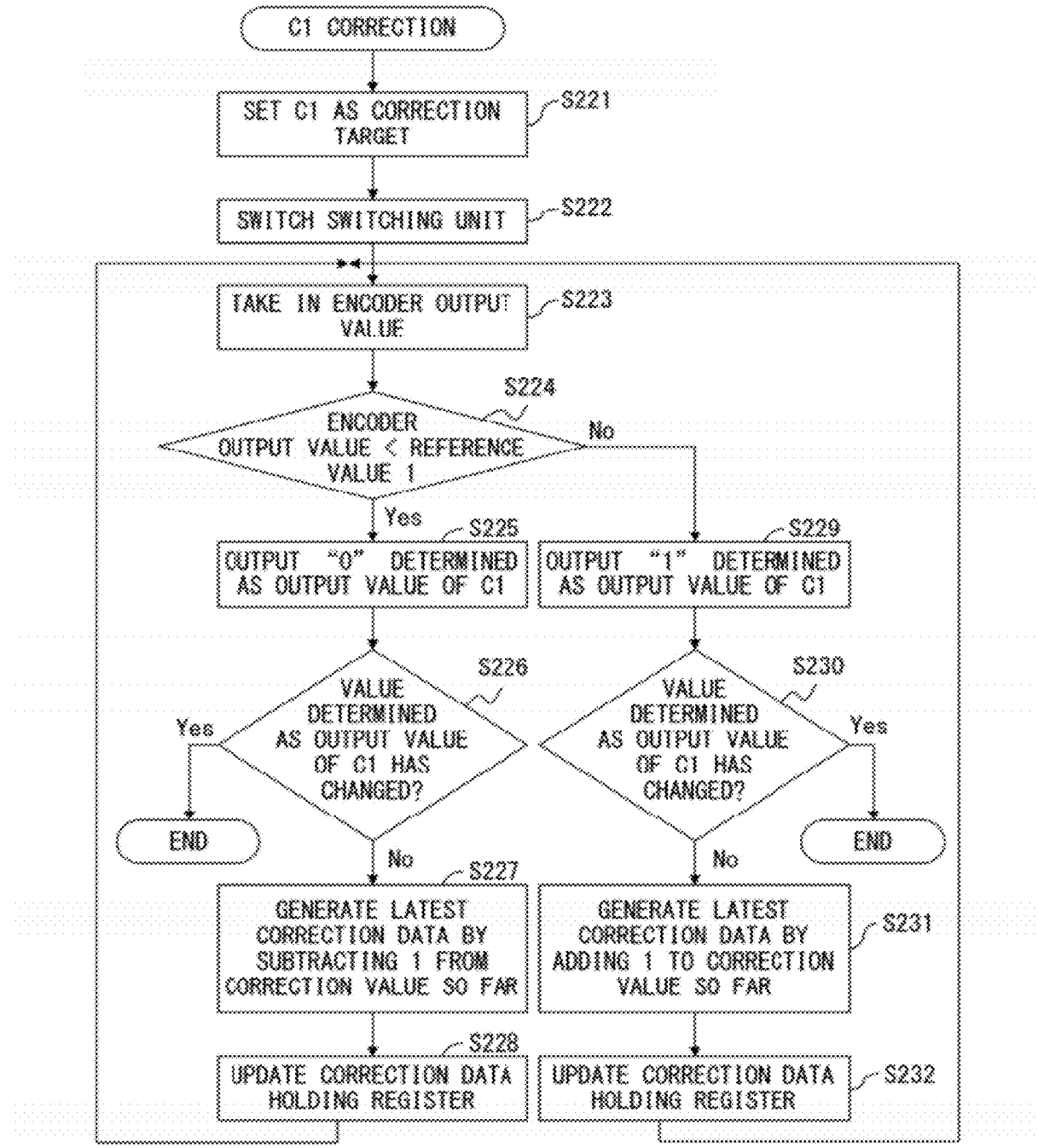
FIG. 12 is a flowchart illustrating the operation in S201.

FIG. 12 is a flowchart illustrating the operation in S201.

As illustrated in FIG. 12, in this operation, first, the control unit 510 sets the correction target comparator identification number to "C1" (S221). Accordingly, the comparator being the correction target is set to the comparator C1.

Next, the control unit 510 controls the switching of the switching unit 200 so that the reference voltage input from the ladder resistance unit 100 to the comparator C1 through the switching unit 200 has the same potential as the reference voltage input from the ladder resistance unit directly to the comparator C1 (S222). Accordingly, in the comparator C1, the ladder reference Vref_lad1 input directly from the ladder resistance unit 100 and the reference voltage Vref_lad1 input from the ladder resistance unit 100 through the switching unit 200 are compared. In addition, in the comparator unit 300, each of the reference voltages Vred_lad1 through Vref_lad15 input directly from the ladder resistance unit 100 and the reference voltage Vref_lad1 input through the switch unit 200 are compared in a parallel manner. Then, the comparison result in the comparator unit 300, that is, the comparison result of the comparators C1 through C15 is converted into a 4-bit digital signal by the encoder 400.

Next, the taking-in unit 530 takes in the output signal (output value) of the encoder 400 in synchronization with the operation clock of the digital assist circuit 500, and outputs it to the comparator output determination unit 530 (comparison unit 532) (S223).

Next, in the comparator output determination unit 530, the reference value selection unit 531 selects the reference value "1" according to the correction target comparator identification number "C1", and outputs it to the comparison unit 532. The comparison unit 532 compares whether or not the value of the output signal of the encoder 400 input from the taking-in unit 520 is smaller than the reference value "1" input from the comparison unit 532 (S224). Then, the comparison result is output to the determined value output unit 533. If the value of the output signal of the encoder 400 is smaller than the reference value according to the comparison result of the comparison unit 532 (Yes in S224), the determined value output unit 533 outputs the value "0" determined as the output value of the comparator C15 (S225). On the other hand, if not (No in S224), the value "1" determined as the output value of the comparator C1 is output (S229).

After S225, the correction data update unit 540 compares the output value "0" of the determined value output unit 533 at this time and the output value of the determined value output unit 533 obtained first after the start of the operation in S201 (S226). However, if the output value "0" at this time is the output value of the determined value output unit 533 obtained first after the start of the operation in S201, the comparison in S226 is not performed. Instead, the correction data update unit 540 holds the output value "0" at this time as the output value of the determined value output unit 533 obtained first after the start of the operation in S201.

In the judgment in S226, if the judgment result is Yes, the correction data update unit 540 outputs a change notification signal to the control unit 510. When the change notification signal is input to the control unit 510, the operation in S201 is terminated and shift to the operation in S202 is performed.

On the other hand, if the judgment result in S226 is No, the correction data update unit 540 reads out correction data for the comparator of the correction target comparator identification number "C1" input from the control unit 510, from the correction data holding register 551. Then, a value in which 1 is subtracted from the value of the read out correction data is generated as the latest correction data (S227). In addition, the correction data update unit 540 updates the correction data for the comparator of the correction target comparator identification number "C1" stored in the correction data holding resister 551 to the latest correction data generated in S227 (S228). Accordingly, until the next update is performed, the latest correction data is output to the comparator C1 as the correction data for the comparator C1.

Meanwhile, after S229, the correction data update unit 540 compares the output value "1" of the determined value output unit 533 at this time and the output value of the determined value output unit 533 obtained first after the start of the operation in S201 (S230). However, if the output value "1" at this time is the output value of the determined value output unit 533 obtained first after the start of the operation in S201, the comparison in S230 is not performed. Instead, the correction data update unit 540 holds the output value "1" at this time as the output value of the determined value output unit 533 obtained first after the start of the operation in S201.

In the judgment in S230, if the judgment result is Yes, the correction data update unit 540 outputs a change notification signal to the control unit 510. When the change notification signal is input to the control unit 510, the operation in S201 is terminated and shift to the operation in S202 is performed.

On the other hand, if the judgment result in S230 is No, the correction data update unit 540 reads out correction data for the comparator of the correction target comparator identification number "C1" input from the control unit 510, from the correction data holding register 551. Then, a value in which 1 is added to the value of the read out correction data is generated as the latest correction data (S231). In addition, the correction data update unit 540 updates the correction data for the comparator of the correction target comparator identification number "C1" stored in the correction data holding resister 551 to the latest correction data generated in S231 (S232). Accordingly, until the next update is performed, the latest correction data is output to the comparator C1 as the correction data for the comparator C1.

After S228 or S232, return to S223 is performed, and after that, the operations described above are repeated until the output value of the determined value output value changes. That is, if the output value of the determined value output unit 533 is "0" first, the operations described above are repeated until the output value becomes "1" (until S230 results in Yes) afterwards. On the other hand, if the output value of the determined value output unit 533 is "1" first, the operations described above are repeated until the output value becomes "0" (until S226 results in Yes) afterwards.

According to the operation in S201 as described above, the offset voltage generated in the comparator C1 is corrected.

Figure 13B:
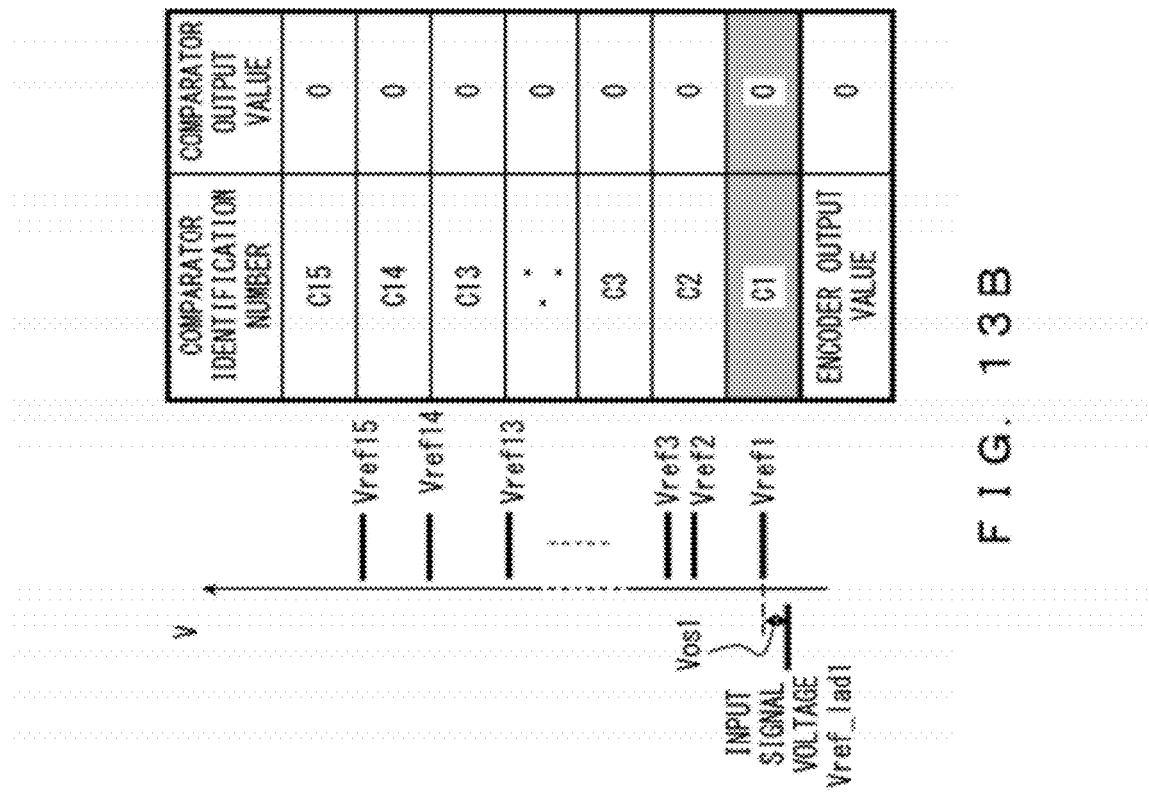
FIGS. 13A, B are diagrams illustrating operation examples in S201.
Figure 13A:
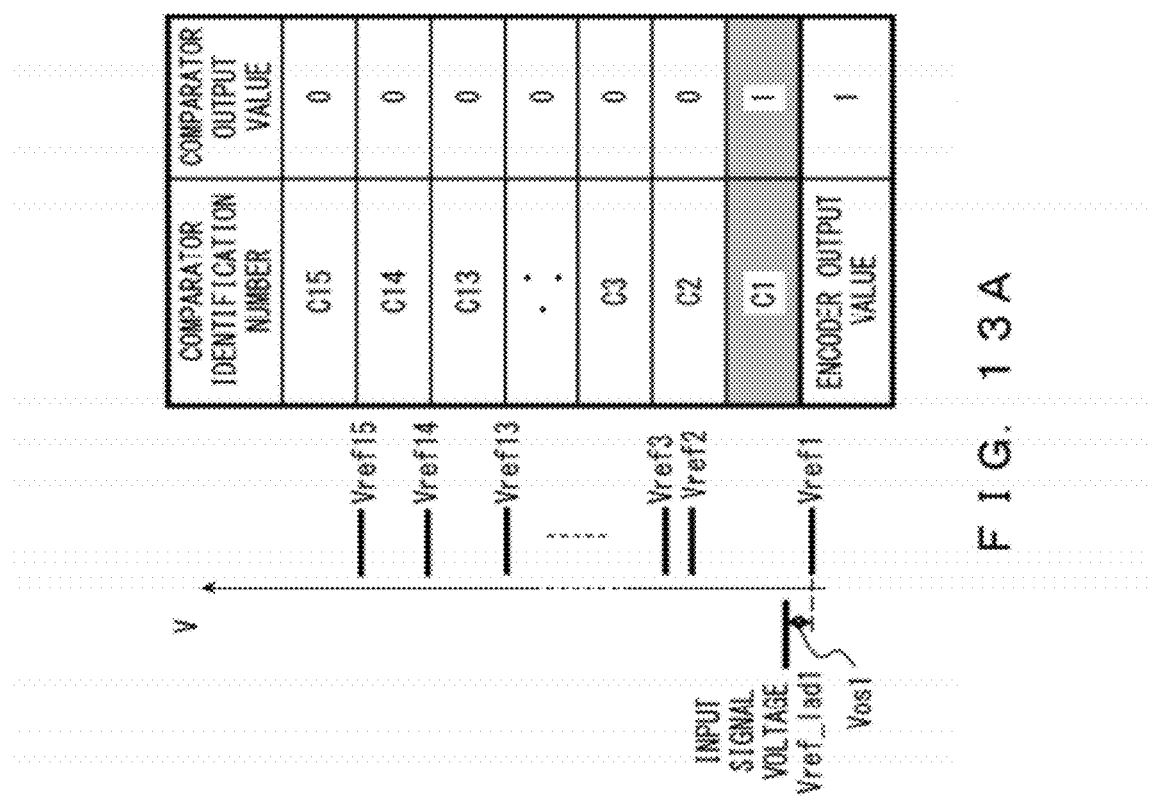

FIGS. 13A, 13B are diagrams illustrating operation examples of S201.

FIG. 13A is a diagram illustrating a case in which an offset voltage $V_{OS}1$ is generated with which, when the switch unit 200 is switched so that the input signal voltage has the same potential as the reference voltage in the comparator C1, the potential of the input signal voltage becomes higher than that of the reference voltage. FIG. 13B is a diagram illustrating a case in which an offset voltage $V_{OS}1$ is generated with which, when the switch unit 200 is switched so that the input signal voltage has the same potential as the reference voltage in the comparator C1, the potential of the input signal voltage becomes lower than that of the reference voltage.

Here, the input signal voltage is the reference voltage Vref_lad1 input from the ladder resistance unit 100 to the comparator C1 through the switch unit 200, which is presented as it is as Vref_lad1 in FIGS. 9A, 9B. Meanwhile, the reference voltage is the reference voltage Vref_lad1 input from the ladder resistance unit 100 directly to the comparator C1, which is presented simply as Vref1 in FIGS. 13A, B. In addition, in FIGS. 13A, B, the other reference voltages Vref_lad2 through Vref_lad115 input from the ladder resistance unit 100 directly to the comparator unit 300 are presented simply as Vref2 through Vref15.

In the example illustrated in FIG. 13A, since the input signal voltage Vref_lad1 has a higher potential than that of the reference voltage Vref1 in the comparator C1, the output value of the comparator C1 becomes "1". On the other hand, since the input signal voltage Vref_lad1 has a lower potential than that of each of the reference voltages Vref2 through Vref15 in the other comparators C2 through C15, the output value becomes "0". As a result, the output value of the encoder 400 becomes "1".

Then, in the comparator output determination unit 530, the output value "1" of the encoder 400 and the reference value "1" corresponding to the correction target comparator identification number "C1" are compared. In this case, since the output value "1" of the encoder 400 is not smaller than the reference value "1", the output value of the comparator output determination unit 530 becomes "1". As a result, in the correction data update unit 540, a value in which 1 is added to the value of the correction data for the comparator C1 read out from the correction data holding register 551 is generated as the latest correction data. Then, the correction data for the comparator C1 stored in the correction data holding register 551 is updated to the latest correction data.

The correction of the offset value for the comparator C1 is performed by repeating the operation as described above until the output value of the comparator output determination unit 530 changes, that is, until its output value becomes "0".

On the other hand, in the example illustrated in FIG. 13B, since the input signal voltage Vref_lad1 has a lower potential than that of the reference voltage Vref1 in the comparator C1, the output value of the comparator C1 becomes "0". In addition, since the input signal voltage Vref_lad1 also has a lower potential than that of each of the reference voltages Vref2 through Vref15 in the other comparators C2 through C15, the output value becomes "0". As a result, the output value of the encoder 400 becomes "0".

Then, in the comparator output determination unit 530, the output value "0" of the encoder 400 and the reference value "1" corresponding to the correction target comparator identification number "C1" are compared. In this case, since the output value "0" of the encoder 400 is smaller than the reference value "1", the output value of the comparator output determination unit 530 becomes "0". As a result, in the correction data update unit 540, a value in which 1 is subtracted from the value of the correction data for the comparator C1 read out from the correction data holding register 551 is generated as the latest correction data. Then, the correction data for the comparator C1 stored in the correction data holding register 551 is updated to the latest correction data.

The correction of the offset value for the comparator C1 is performed by repeating the operation as described above until the output value of the comparator output determination unit 530 changes, that is, until its output value becomes "1".

Such operations are performed in a similar way in each of following S202 through S215, performing the correction of the offset voltage for each of the comparators C2 through C15.

As described above, the operation to correct the offset voltage can be performed for each of the comparators C1 through C15 also by the offset correction operation modified too reverse the order of comparators to be the target of the offset voltage correction.

In addition, for the ADC according to the present embodiment, as long as the value of the offset value generated in each of the comparators C1 through C15 is lower than the voltage value corresponding to ±0.5LSB, the order of the comparator to be the target of the offset voltage correction may be random. For example, it is possible except for a case of reversion such as Vref14>Vref15.

Embodiment 2

An analog-to-digital conversion apparatus according to embodiment 2 is, as well as the ADC according to embodiment 1, an ADC in the parallel comparison system that converts an analog signal to a 4-bit digital signal, which is capable of performing, other than the analog-to-digital conversion operation as the normal operation, an offset correction operation.

However, even if an offset voltage of a voltage corresponding to equal to or above 1LSB and smaller than 2LSB, the ADC according to the present embodiment is capable of correcting it properly.

First, before making explanation of the ADC according to the present embodiment, a problem that arises when the offset voltage generated in the comparator is a voltage corresponding to equal to or above 1LSB and smaller than 2LSB is described.

Figure 14A:
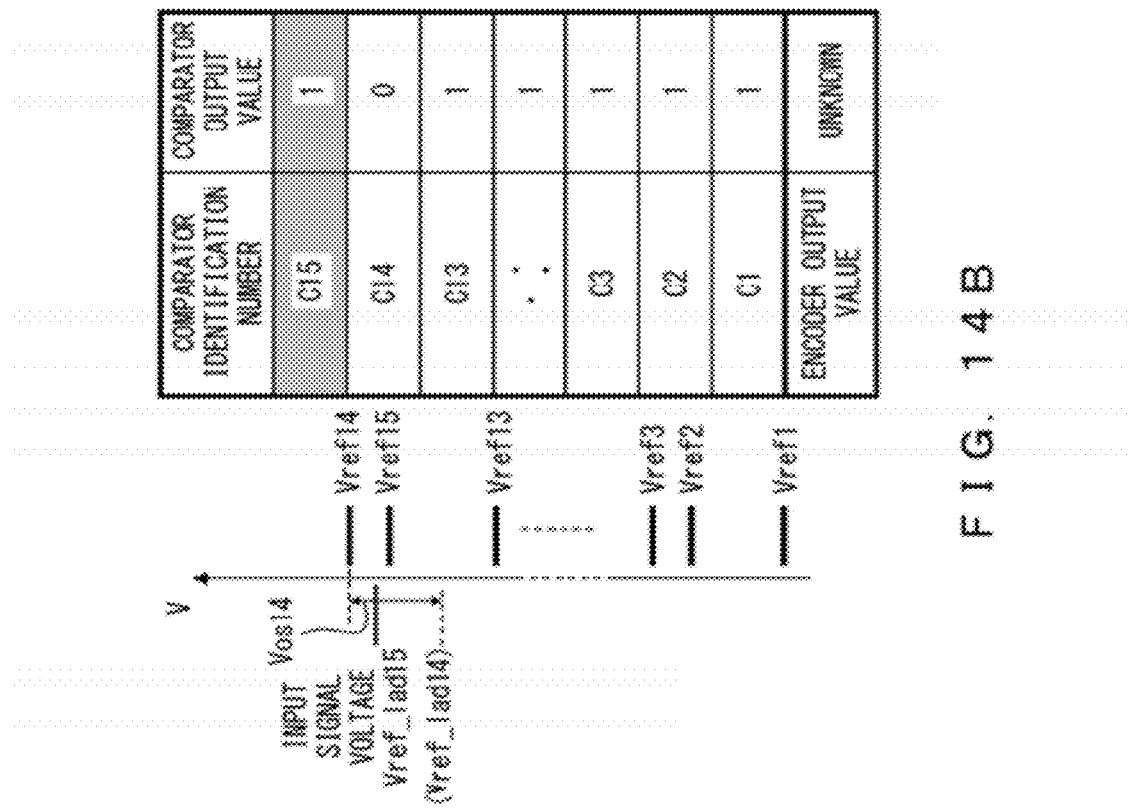
FIGS. 14A, B are diagrams illustrating operation examples in S101 when the offset voltage generated in the comparator is a voltage corresponding to 1LSB or larger and smaller than 2LSB.

FIGS. 14A, B are diagrams illustrating operation examples in S101 in such a case.

Figure 14B:
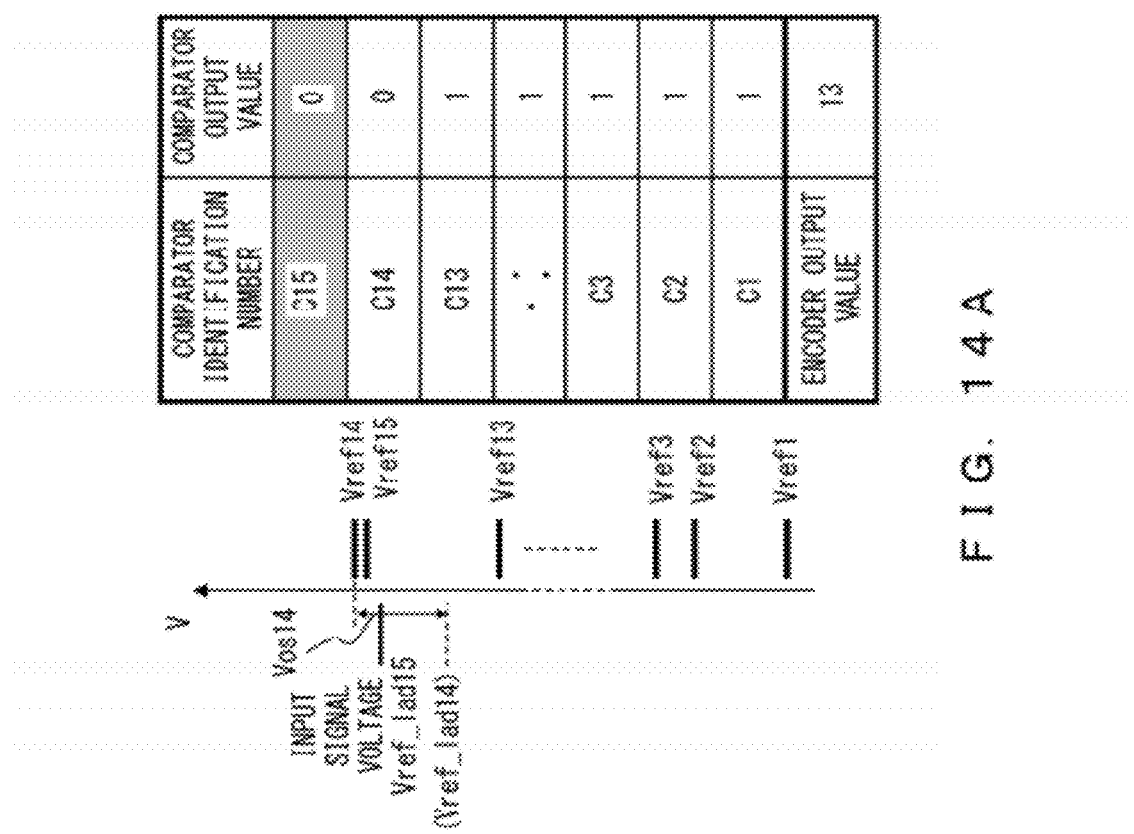

FIG. 14A is a diagram illustrating a case in which an offset voltage is generated with which, when the switch unit 200 is switched so that the input signal voltage has the same potential as the reference voltage in the comparator C15, the potential of the input signal voltage becomes lower than that of the reference voltage. FIG. 14B is a diagram illustrating a case in which an offset voltage is generated with which, when the switch unit 200 is switched so that the input signal voltage has the same potential as the reference voltage in the comparator C15, the potential of the input signal voltage becomes higher than that of the reference voltage. However, in the examples illustrated in FIGS. 14A, B, it is assumed that the offset voltage generated in the comparator C14 is a voltage corresponding to equal to or above 1LSB and smaller than 2LSB.

In the example illustrated in FIG. 14A, since the input signal voltage Vref_lad15 has a lower potential than the reference voltage Vref15, the output value of the comparator C15 becomes "0".

Meanwhile, in the comparator C14, since the input signal voltage Vref_lad15 has a lower potential than that of the reference voltage Vref14, the output value of the comparator C14 also becomes "0". Meanwhile, the offset voltage $V_{OS}14$ is a voltage with which, when the switch unit 200 is switched so that the input signal voltage has the same potential as the reference voltage in the comparator C14, the potential of the input signal voltage becomes lower than that of the reference voltage. The input signal voltage of the comparator C14 at this time is the reference voltage Vref_lad14 input from the ladder resistance unit 100 to the comparator C14 through the switch unit 200, which is presented as it is as Vref_lad14 in FIG. 14A.

On the other hand, in each of the other comparators C1 through C13, since the input signal voltage Vref_lad15 has a higher potential than the reference voltages Vref1 through Vref13, the output value becomes "1".

The encoder 400 can output a correct value in the state in which successive comparators from the comparator C1 in the order running from the comparator C1 to the C15 output "1", or the output value of all the comparators is "0".

Therefore, in this case, since the output value of each of the comparators C1 through C13 is "1", and the output value of the comparators C14 and C15 is "0", the encoder 400 can output a correct value ("13").

In contrast, in the example illustrated in FIG. 14B, since the input signal voltage Vref_lad15 has a higher potential than the reference voltage Vref15 in the comparator C15, the output of the comparator C15 becomes "1". Meanwhile, in the comparator C14, since the input signal voltage Vref_lad15 has a lower potential than the reference voltage Vref14, the output value of the comparator C15 becomes "0". Meanwhile, the offset voltage $V_{OS}14$ is the same as in the example illustrated in FIG. 14A. In the other comparators C1 through C13, since the input signal voltage Vref_lad15 has a higher potential than that of each of the reference voltages Vref1 through Vref13, the output value becomes "1".

In this case, the state of the output value of the comparators C1 through C15 is not in the state in which successive comparators from the comparator C1 in the order running from the comparator C1 to the C15 output "1", or the output value of all the comparators is "0". Therefore, there is a concern that the encoder 400 may not be able to output a correct value. If the encoder 400 outputs a value smaller than "15", the output value of the comparator output determination unit 530 becomes "0" while it should be "1" originally, making it impossible to perform correction of the offset voltage for the comparator C15 properly.

Then, the ADC according to the present embodiment has the following configuration and operation so that correction can be done properly even if the offset voltage is a voltage corresponding to equal or above 1LSB and smaller than 2LSB.

First, the ADC according to the present embodiment uses 4-bit data as correction data, and uses its highest order bit as a sign bit. As well as the ADC according to embodiment 1, when the highest order bit is "0", it indicates that the value of correction data (correction value) is positive, and when it is "1", it indicates that the value of correction data (correction value) is negative.

Meanwhile, for the ADC according to the present embodiment, the correction amount range in which the offset voltage can be corrected with the 4-bit correction data is assumed as the range of the voltage value corresponding to ±2LSB.

FIG. 15 is a diagram illustrating the correction amount range.

As illustrated in FIG. 15, in the ADC according to the present embodiment, correction in seven stages respectively on the positive side and the negative side. i.e., correction in 15 stages in total can be performed.

In FIG. 15, the range between the correction amount by correction data "0000" indicating the correction value "0" at the time of the offset correction operation start and the correction amount by correction data "0111" indicating the maximum value "+7" of the correction value is the correction amount range on the positive side. Meanwhile, the range between the correction amount by correction data "0000" indicating the correction value "0" at the time of the offset correction operation start and the correction amount by correction data "1111" indicating the minimum value "−7" of the correction value is the correction amount range on the negative side. Then, the range combining the correction amount ranges on the positive side and the negative side is the range of the voltage value corresponding to ±2LSB. Meanwhile, in FIG. 15, ΔV is the amount of change of the correction amount when the correction value changes by 1.

In addition, in the ADC according to the present embodiment, due to the usage of 4-bit correction data, the configuration of the data conversion unit 600 and the offset correction units 700, 800 included in the comparator is different from that in the ADC according to embodiment 1, and is configured as follows.

In the comparator according to the present embodiment, when 4-bit correction data is input to the data conversion unit, the data conversion unit 600 converts the lower three bits of the correction data into a 7-bit digital signal. In this conversion, for example, when the lower three bits of the correction data are "000", they are converted into a 7-bit digital signal "0000000". Meanwhile, for example, when the lower three bits of the correction data are "100", they are converted into a 7-bit digital signal "0001111". Meanwhile, for example, when the lower three bits of the correction data are "111", they are converted into a 7-bit digital signal "1111111". Then, the converted 7-bit digital signal is output to the offset correction unit 700 or 800 according to the value of the highest order bit of the correction data. That is, when the value of the highest order bit of the correction data is "1" (the correction value is a negative value), the converted digital signal is output to the offset correction unit 700 as a digital signal 701. Meanwhile, when the value of the highest order bit of the correction data is "0" (the correction value is a positive value), the converted digital signal is output to the offset correction unit 800 as a digital signal 801. However, when the converted digital signal is output to the offset correction unit 700 as the digital signal 701, a 7-bit digital signal "0000000" is output to the offset correction unit 800 as the digital signal 801. On the other hand, when the converted digital signal is output to the offset correction unit 800 as the digital signal 801, a 7-bit digital signal "0000000" is output to the offset correction unit 700 as the digital signal 701.

The offset correction unit 700 includes, as described above, n units of switches 711, 712, ... 71n, n units of N-type MOS transistor 721, 722, ... 72n, and n units of switches 731, 732, ... 73n and switches 702, 703. In this embodiment, n is assumed to be 7 or more.

When the n units of switches 711, 712 ... 71n receives a code signal composed of a digital signal of a plurality of bits output from the data conversion unit 600, among the n units, the number of switches corresponding to the binary number expressed by the digital signal enters the connected state, and the other switches are maintained in the disconnected state. Accordingly, for example, when the digital signal is "0000000", all the switches are in the disconnected state. In addition, for example, when the digital signal is "0001111", four switches enter the connected state. In addition, for example, when the digital signal is "1111111", seven switches enter the connected state.

The offset correction unit 800 includes, as described above, n units of switches 811, 812, ... 81n, n units of N-type MOS transistor 821, 822, ... 82n, and n units of switches 831, 832, ... 83n and switches 802, 803. In this embodiment, n is assumed to be 7 or more, as described above.

When the n units of switches 811, 812 ... 81n receives a code signal composed of a digital signal of a plurality of bits output from the data conversion unit 600, among the n units, the number of switches corresponding to the binary number expressed by the digital signal enters the connected state, and the other switches are maintained in the disconnected state. Accordingly, for example, when the digital signal is "0000000", all the switches are in the disconnected state. In addition, for example, when the digital signal is "0001111", four switches enter the connected state. In addition, for example, when the digital signal is "1111111", seven switches enter the connected state.

In addition, in the ADC according to the present embodiment, a part of the configuration of the digital assist circuit 500 differs from that in the ADC according to embodiment 1.

Figure 16:
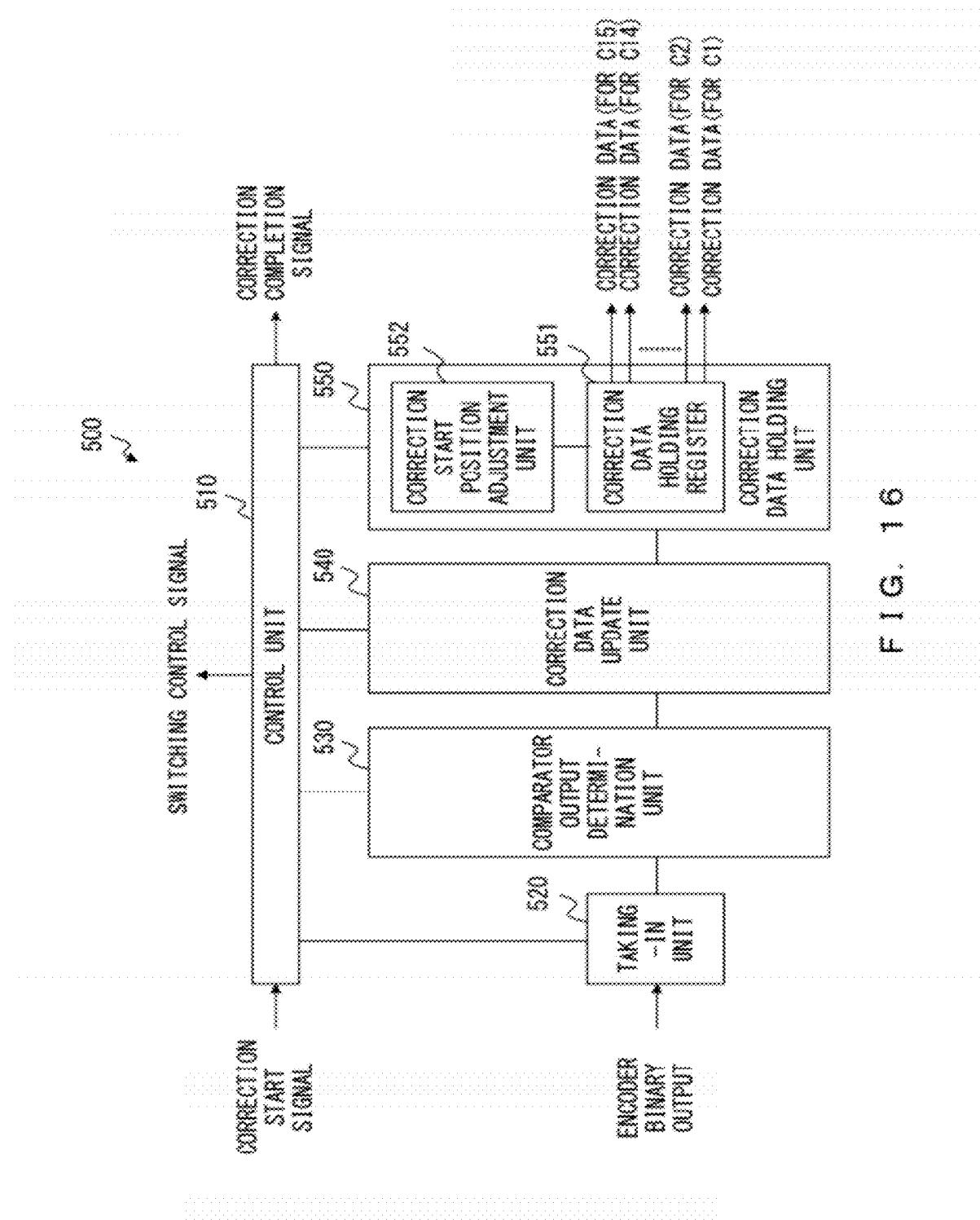
FIG. 16 is a diagram illustrating a configuration example of a digital assist circuit included in an ADC being an analog digital conversion apparatus according to embodiment 2.

FIG. 16 is a diagram illustrating a configuration example of the digital assist circuit 500 according to the present embodiment.

As illustrated in FIG. 16, the digital assist circuit 500 according to the present embodiment differs from the digital assist circuit 500 illustrated in FIG. 1 in that the correction data holding unit 550 further has a correction start position adjustment unit 552, and that 4-bit data is used as correction data.

At the time of the offset correction operation, the correction start position adjustment unit 552 stores, in the correction data holding register 551, correction data indicating the correction minimum value as correction data for each comparator, before performing correction of the offset voltage for each of the comparators C1 through C15. Meanwhile, the correction data indicating the correction minimum value is 4-bit data "1111" as illustrated in FIG. 15.

The other configurations of the ADC according to the present embodiment is similar to those in the ADC according to embodiment 1, so description for them is omitted here.

Next, the operation of the ADC according to the present embodiment is described.

The ADC according to the present embodiment is capable of performing, other than the analog-to-digital conversion operation as the normal operation, an offset correction operation as described above. Therefore, the offset correction operation is described here as an operation of the ADC according to the present embodiment.

Figure 17:
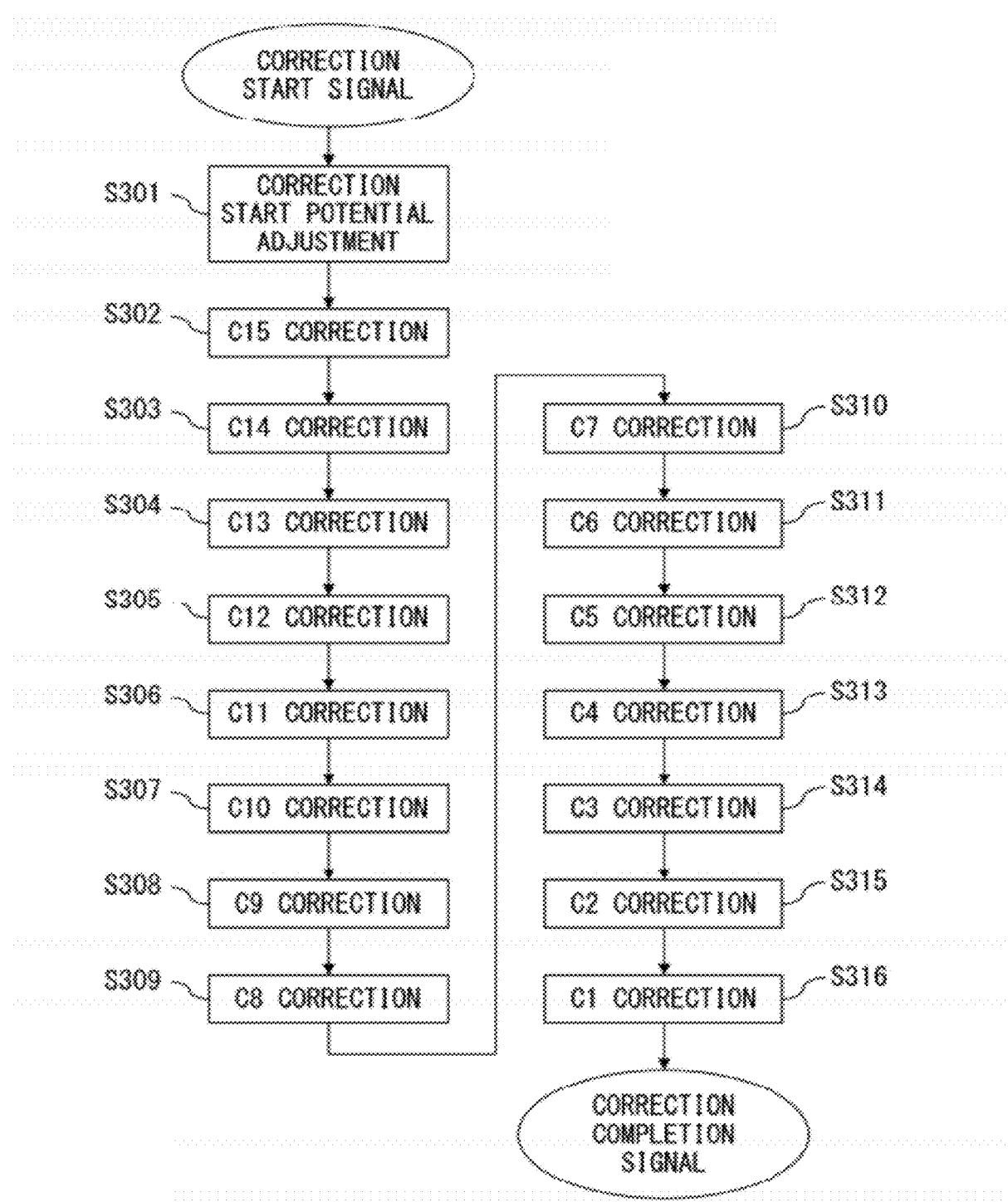
FIG. 17 is a flowchart illustrating an offset correction operation of an ADC being an analog-to-digital conversion apparatus according to embodiment 2.

FIG. 17 is a flowchart illustrating the offset correction operation.

As illustrated in FIG. 17, the offset correction operation of the present embodiment differs from the offset correction operation illustrated in FIG. 7 in that a correction start potential adjustment process (S301) is added, and that 4-bit data is used as correction data, and is performed as follows.

As illustrated in FIG. 17, the offset correction operation according to the present embodiment starts when a correction start signal is input to the control unit 510 of the digital assist circuit 500 from a control unit in a higher plane provided in the ADC according to the present embodiment and is not illustrated in the drawing.

When the offset correction operation starts, first, the correction data holding unit 550 clears correction data for each of the comparators C1 through C15 stored in the correction data holding register 551. Accordingly, in the correction data holding register 551, 4-bit data of "0000" is stored as correction data for each of the comparators C1 through C15, and the correction data is output from the correction data holding unit 550 to the comparators C1 through C15.

Meanwhile, in the offset correction operation according to the present embodiment, such an operation to clear correction data may be omitted.

Next, the correction start position adjustment unit 552 performs a correction start potential adjustment process (S301). In this process, the correction start position adjustment unit 552 stores, in the correction data holding register 551, 4-bit data "1111" indicating the correction minimum value "−7" as correction data for each of the comparators C1 through C15. Accordingly, the correction data is output to the comparators C1 through C15 from the correction data holding register 550, and the offset voltage generated in the comparators C1 through C15 changes by the voltage corresponding to the correction data (a voltage corresponding to 2LSB).

Next, in the order from the comparator C15 to C1, the operation to correct the offset voltage is performed for each of the comparators C1 through C15 (S302 through S316). Meanwhile, the operations in S302 through S316 are similar to the operations in S101 through S115 in embodiment 1 except that 4-bit data is used as the correction data.

When S302 through S316 are completed, the control unit 510 controls the switching of the switch unit 200 so that the signal input from the switch unit 200 to the comparator unit 300 becomes an analog input signal (ADC_in), and outputs a correction completion signal to the control unit in a higher plane.

Then, when the correction completion signal is input from the control unit 510 to the control unit in a higher plane, the ADC according to the present embodiment shifts to the normal operation.

FIGS. 18A, B are diagrams illustrating cases in which such an offset correction operation is performed in the example illustrated in FIG. 14B.

In the example illustrated in FIG. 14B, when the offset correction operation starts and the operation in S301 is performed, the offset voltage generated in each of the comparators C1 through C15 changes by a voltage corresponding to the 4-bit data "1111" (a voltage corresponding to 2LSB).

Then, the operation in S302 starts, and the switching of the switch unit 200 is performed so that the input signal voltage has the same potential as the reference voltage in the comparator C15.

FIG. 18A illustrates an operation example of S302 at this time.

As illustrated in FIG. 18A, when the switch unit 200 is switched so that the input signal voltage has the same potential as the reference voltage in the comparator C15, it results in a state in which the input signal voltage has a higher potential than the reference voltage of each of the comparators C1 through C15. That is, it results in a state in which the input signal voltage Vref_lad15 has a higher voltage than each of the reference voltages Vref1 through Vref15. Therefore, in this case, since the input signal voltage Vref_lad15 has a higher potential than the reference voltage Vref15 in the comparator C15, the output value of the comparator C15 becomes "1". In addition, in each of the other comparators C1 through C14, since the input signal voltage Vref_lad15 has a higher potential than each of the reference voltages Vref1 through Vref14, the output value becomes "1". As a result, the output value of the encoder 400 becomes "15".

Then, in the comparator output determination unit 530, the output value "15" of the encoder 400 and the reference value "15" corresponding to the correction target comparator identification number "C15" are compared. In this case, since the output value "15" of the encoder 400 is not smaller than the reference value "15", the output value of the comparator output determination unit 530 becomes "1". As a result, in the correction data update unit 540, a value in which 1 is added to the value of the correction data for the comparator C15 read out from the correction data holding register 551 is generated as the latest correction data. Then, the correction data for the comparator C15 stored in the correction data holding register 551 is updated to the latest correction data.

Such operations are repeated until the output value of the comparator output determination unit changes, that is, until its output value becomes "0", performing the correction of the offset voltage for the comparator C15.

When the operation in S302 is completed as described above, the operation in S303 starts next, and the switching of the switch unit 200 is performed so that the input signal voltage has the same potential as the reference voltage in the comparator C14.

FIG. 18B illustrates an operation example of S303 at this time.

As illustrated in FIG. 18B, when the switch unit 200 is switched so that the input signal voltage has the same potential as the reference voltage in the comparator C14, it results in a state in which the input signal voltage has a higher potential than the reference voltage of each of the comparators C1 through C14. That is, it results in a state in which the input signal voltage Vref_lad14 has a higher voltage than each of the reference voltages Vref1 through Vref14. Meanwhile, at this time, the correction of the offset voltage generated in the comparator C15 is completed by the operation in S302, and it results in a state in which the input signal voltage Vref_lad14 has a lower potential than the reference voltage Vref15 of the comparator C15. Therefore, in this case, since the input signal voltage Vref_lad14 has a lower potential than the reference voltage Vref15 in the comparator C15, the output value of the comparator C15 becomes "0". Meanwhile, in each of the other comparators C1 through C14, since the input signal voltage Vref_lad14 has a higher potential than each of the reference voltages Vref1 through Vref14, the output value becomes "1". As a result, the output value of the encoder 400 becomes "14".

Then, in the comparator output determination unit 530, the output value "14" of the encoder 400 and the reference value "14" corresponding to the correction target comparator identification number "C14" are compared. In this case, since the output value "14" of the encoder 400 is not smaller than the reference value "14", the output value of the comparator output determination unit 530 becomes "1". As a result, in the correction data update unit 540, a value in which 1 is added to the value of the correction data for the comparator C14 read out from the correction data holding register 551 is generated as the latest correction data. Then, the correction data for the comparator C14 stored in the correction data holding register 551 is updated to the latest correction data.

Such operations are repeated until the output value of the comparator output determination unit changes, that is, until its output value becomes "0", performing the correction of the offset voltage for the comparator C14.

The operation as described above is performed in a similar way in each of following S303 through S316, performing the correction of the offset voltage for each of the comparators C1 through C13.

As described above, with the ADC according to the present embodiment, similar effects as those of the ADC according to embodiment 1 can be obtained.

In addition, in the ADC according to the present embodiment, a correction start potential adjustment process (S301) is performed before performing correction of the offset voltage for each of the comparators C1 through C15, in the offset correction operation. Accordingly, when the switch unit 200 is switched so that the input signal voltage has the same potential as the reference voltage in a comparator being the target of correction in each of following S302 through S316, the output value of each comparator is always as described below. That is, the comparator being the target of correction enters the state in which the input signal voltage has a higher potential than the reference voltage, and its output value becomes "1". Meanwhile a comparator for which correction of the offset voltage has been completed (a comparator whose reference value is higher than that of the comparator being the target of correction) enters the state in which the input signal voltage has a lower potential than the reference value, and its output value becomes "0". In addition, a comparator for which correction of the offset voltage has not been completed (a comparator whose reference value is lower than that of the comparator being the target of correction) enters the state in which the input signal voltage has a higher potential than the reference voltage, and its output becomes "1". Therefore, since the output values of all the comparator C1 through the comparator being the target of correction become "1", and the output values of all the other comparators become "0", the encoder 400 can output a correct value. Therefore, even if the value of the offset voltage generated in each of the comparators C1 through C15 is a voltage value corresponding to equal to or above 1LSB and smaller than 2LSB, correction of the offset voltage for each comparator can be performed properly.

Meanwhile, the ADC according to the present embodiment may also be modified in various ways.

For example, the offset correction operation illustrated in FIG. 17 above may be modified to reverse the order of comparators to be the target of offset voltage correction.

Figure 19:
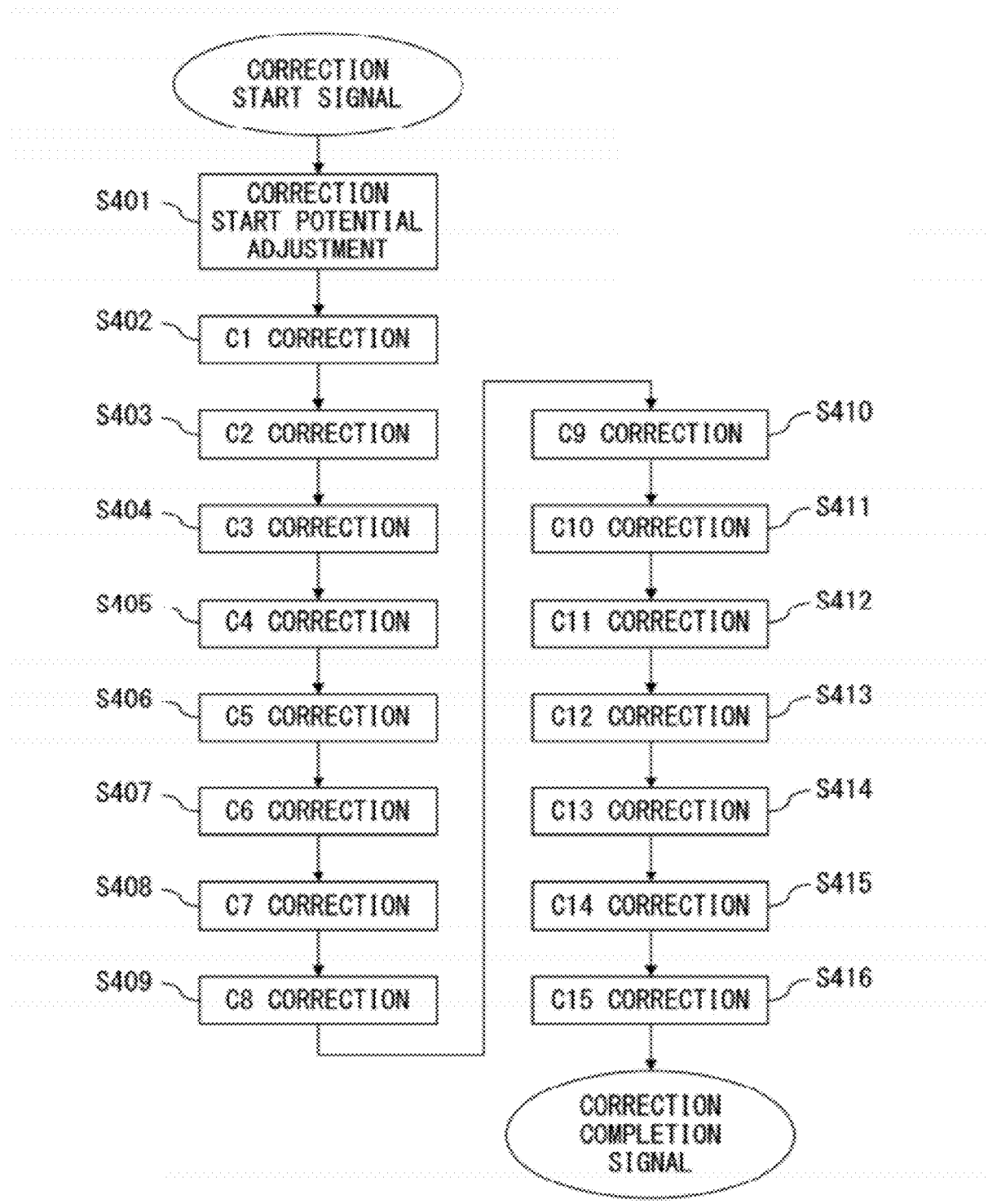
FIG. 19 is a flowchart illustrating an offset correction operation according to a variation example of an ADC being an analog-to-digital conversion apparatus according to embodiment 2.

FIG. 19 is a flowchart illustrating the offset correction operation according to such a modification example.

As illustrated in FIG. 19, in this operation, the operation to correct the offset voltage is performed for each of the comparators C1 through C15 in the order from the comparator C1 to the comparator C15 (S402 through S416). In S402 through S416, S302 through S316 presented in FIG. 17 mentioned above performed simply in the reverse order, so each of S402 through S416 is basically the same operation as each of S302 through S316.

However, due to the reversion of the order in such a way, the following operation is performed in the correction start potential adjustment process in S401. That is, the correction start position adjustment unit 552 stores, in the correction data holding register 551, 4-bit data "0111" indicating the correction maximum value "+7" as correction data for each of the comparators C1 through C15. Accordingly, the correction data is output from the correction data holding unit 550 to the comparators C1 through C15, and the offset voltage generated in each of the comparators C1 through C15 changes by the voltage corresponding to the correction data (a voltage corresponding to 2LSB).

Operations in the other parts are the same as those in the offset correction operation illustrated in FIG. 17 mentioned above.

Next, an example of the offset correction operation performed as described above is explained.

First, before making the explanation, a problem that arises in the case in which, when the offset correction operation illustrated in FIG. 11 is performed in the ADC according to embodiment 1, the offset voltage generated in the comparator is a voltage corresponding to equal to or above 1LSB and smaller than 2LSB. Meanwhile, the offset correction operation illustrated in FIG. 11 is, as well as the offset correction operation illustrated in FIG. 19, an operation to correct the offset voltage for the comparators C1 through C15 in the order from the comparator C1 to C15.

Figure 20:
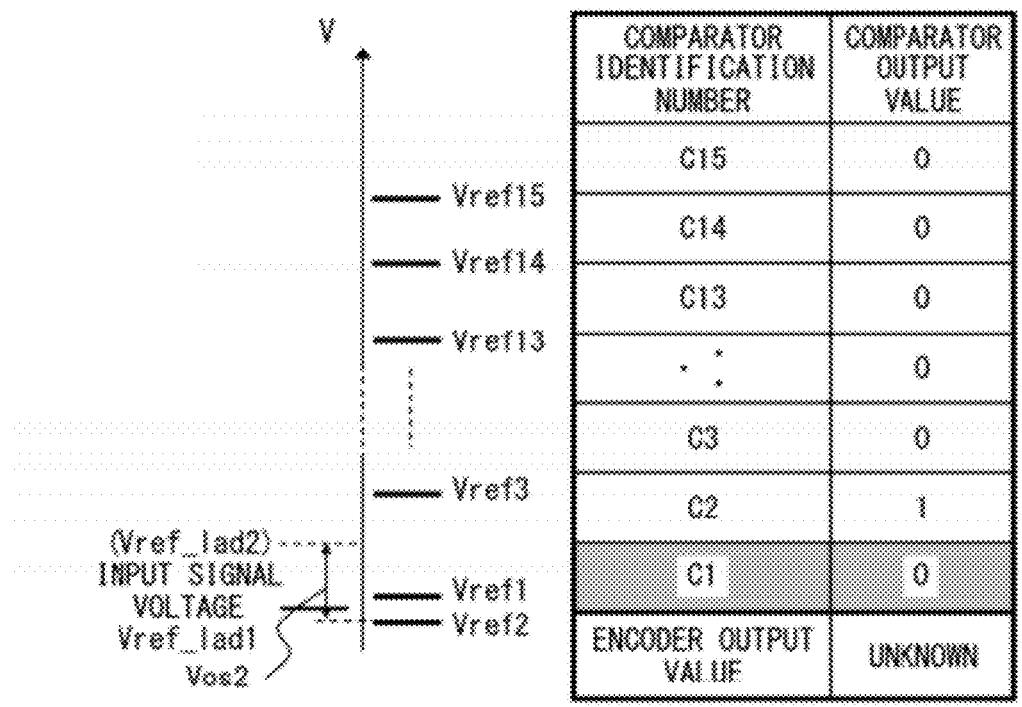
FIG. 20 is a diagram illustrating operation examples in S201 when the offset voltage generated in the comparator is a voltage corresponding to 1LSB or larger and smaller than 2LSB.

FIG. 20 is a diagram illustrating an operation example in S201 in such a case,

The example illustrated in FIG. 20 is an example of a case in which an offset voltage is generated with which, when the switch unit 200 is switched so that the input signal voltage has the same potential as the reference voltage in the comparator C1, the potential of the input signal voltage becomes lower than that of the reference voltage. In this example, it is assumed that the offset voltage generated in the comparator C2 is a voltage corresponding to equal to or above 1LSB and smaller than 2LSB.

As illustrated in FIG. 20, since the input voltage Vref_lad1 has a lower potential than the reference voltage Vref1 in the comparator C1, the output value of the comparator C1 becomes "0".

Meanwhile, in the comparator C2, since the input signal voltage Vref_lad1 has a higher potential than that of the reference voltage Vref2, the output value of the comparator C2 becomes "1". Meanwhile, the offset voltage $V_{OS}2$ generated in the comparator C2 is a voltage with which, when the switch unit 200 is switched so that the input signal voltage has the same potential as the reference voltage in the comparator C2, the potential of the input signal voltage becomes higher than that of the reference voltage. The input signal voltage of the comparator C2 at this time is the reference voltage Vref_lad2 input from the ladder resistance unit 100 to the comparator C2 through the switch unit 200, which is presented as it is as Vref_lad2 in FIG. 20.

Meanwhile, in each of the other comparators C3 through C15, since the input signal voltage Vref_lad1 has a higher potential than the reference voltages Vref3 through Vref15, the output value becomes "0".

In this case, the state of the output value of the comparators C1 through C15 is not in the state in which successive comparators from the comparator C1 in the order running from the comparator C1 to the C15 output "1", or the output value of all the comparators is "0". Therefore, there is a concern that the encoder 400 may not be able to output a correct value. If the encoder 400 outputs a value equal to or larger than "1", the output value of the comparator output determination unit 530 becomes "1" while it should be "0" originally, making it impossible to perform correction of the offset voltage for the comparator C1 properly.

By contrast, according to the offset correction operation illustrated in FIG. 19, the operation is performed as follows for the example illustrated in FIG. 20.

When the offset correction operation starts and the operation in S401 is performed, the offset voltage generated in each of the comparators C1 through C15 changes by a voltage corresponding to the 4-bit data "0111" (a voltage corresponding to 2LSB).

Then, the operation in S402 starts, and the switching of the switch unit 200 is performed so that the input signal voltage has the same potential as the reference voltage in the comparator C1.

Figure 21B:
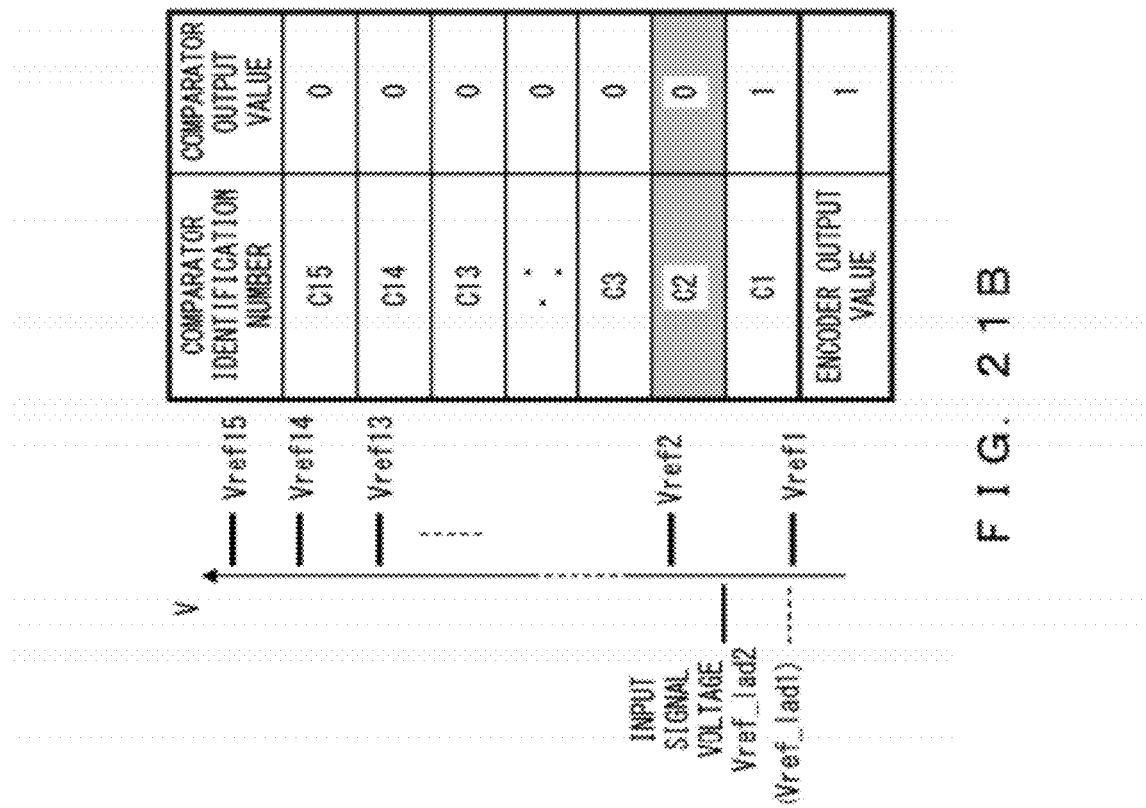
FIG. 21B is a diagram illustrating an operation example in S403.
Figure 21A:
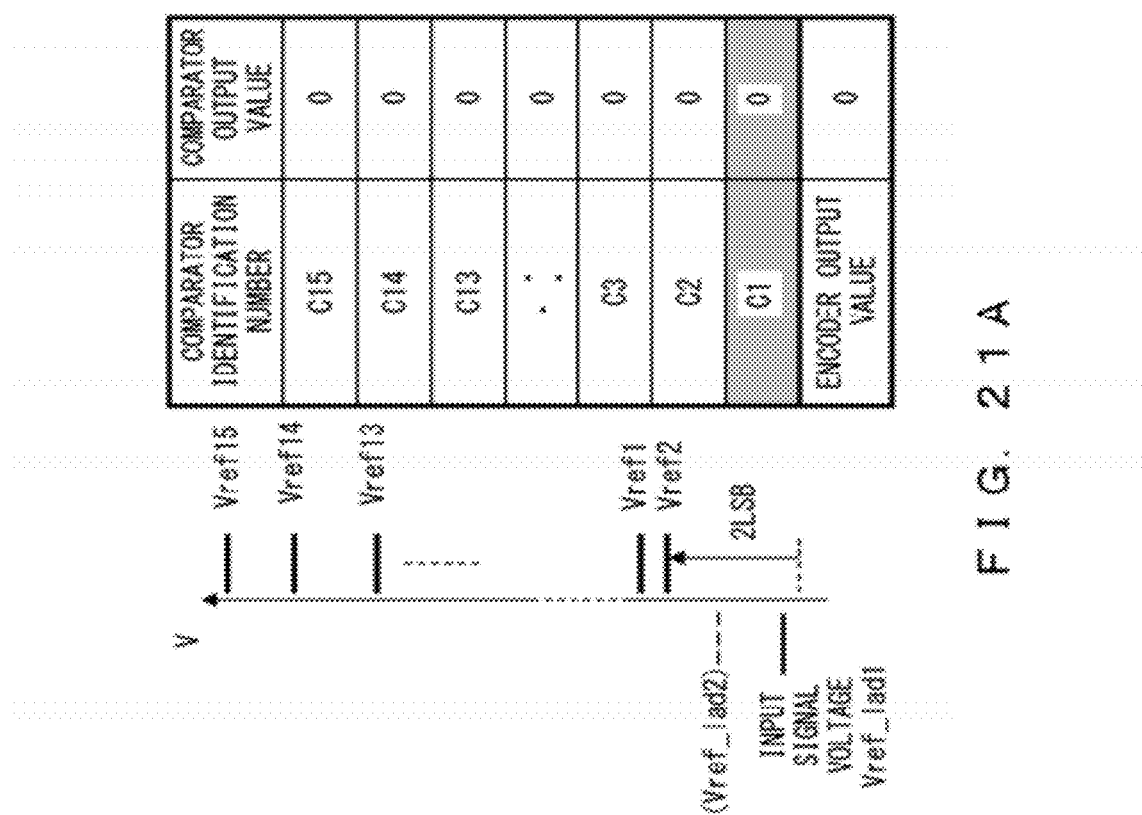
FIG. 21A is a diagram illustrating an operation example in S402.

FIG. 21A illustrates an operation example of S402 at this time.

As illustrated in FIG. 21A, when the switch unit 200 is switched so that the input signal voltage has the same potential as the reference voltage in the comparator C1, it results in a state in which the input signal voltage has a lower potential than the reference voltage of each of the comparators C1 through C15. That is, it results in a state in which the input signal voltage Vref_lad1 has a lower voltage than each of the reference voltages Vref1 through Vref15. Therefore, in this case, since the input signal voltage Vref_lad1 has a lower potential than the reference voltage Vref1 in the comparator C1, the output value of the comparator C1 becomes "0". In addition, in each of the other comparators C2 through C15, since the input signal voltage Vref_lad1 has a lower potential than each of the reference voltages Vref2 through Vref15, the output value becomes "0". As a result, the output value of the encoder 400 becomes "0".

Then, in the comparator output determination unit 530, the output value "0" of the encoder 400 and the reference value "1" corresponding to the correction target comparator identification number "C1" are compared. In this case, since the output value "0" of the encoder 400 is smaller than the reference value "1", the output value of the comparator output determination unit 530 becomes "0". As a result, in the correction data update unit 540, a value in which 1 is subtracted from the value of the correction data for the comparator C1 read out from the correction data holding register 551 is generated as the latest correction data. Then, the correction data for the comparator C1 stored in the correction data holding register 551 is updated to the latest correction data.

Such operations are repeated until the output value of the comparator output determination unit changes, that is, until its output value becomes "1", performing the correction of the offset voltage for the comparator C1.

When the operation in S402 is completed as described above, the operation in S403 starts next, and the switching of the switch unit 200 is performed so that the input signal voltage has the same potential as the reference voltage in the comparator C2.

FIG. 21B illustrates an operation example of S403 at this time.

As illustrated in FIG. 21B, when the switch unit 200 is switched so that the input signal voltage has the same potential as the reference voltage in the comparator C2, it results in a state in which the input signal voltage has a lower potential than the reference voltage of each of the comparators C2 through C15. That is, it results in a state in which the input signal voltage Vref_lad2 has a lower voltage than each of the reference voltages Vref2 through Vref15. Meanwhile, at this time, the correction of the offset voltage generated in the comparator C1 is completed by the operation in S402, and it results in a state in which the input signal voltage Vref_lad2 has a higher potential than the reference voltage Vref1 of the comparator C1. Therefore, in this case, since the input signal voltage Vref_lad2 has a higher potential than the reference voltage Vref1 in the comparator C1, the output value of the comparator C1 becomes "1". Meanwhile, in each of the other comparators C2 through C15, since the input signal voltage Vref_lad2 has a lower potential than each of the reference voltages Vref2 through Vref15, the output value becomes "0". As a result, the output value of the encoder 400 becomes "1".

Then, in the comparator output determination unit 530, the output value "1" of the encoder 400 and the reference value "2" corresponding to the correction target comparator identification number "C2" are compared. In this case, since the output value "1" of the encoder 400 is smaller than the reference value "2", the output value of the comparator output determination unit 530 becomes "0". As a result, in the correction data update unit 540, a value in which 1 is subtracted from the value of the correction data for the comparator C2 read out from the correction data holding register 551 is generated as the latest correction data. Then, the correction data for the comparator C2 stored in the correction data holding register 551 is updated to the latest correction data.

Such operations are repeated until the output value of the comparator output determination unit changes, that is, until its output value becomes "1", performing the correction of the offset voltage for the comparator C2.

The operation as described above is performed in a similar way in each of following S403 through S416, performing the correction of the offset voltage for each of the comparators C3 through C15.

As described above, the operation to correct the offset value for the comparators C1 through C15 can also be performed by the offset correction operation modified so as to reverse the order of the comparators to be the target of the offset voltage correction.

Meanwhile, according the offset correction operation as described above, when the switch unit 200 is switched so that the input signal voltage has the same potential as the reference voltage in a comparator being the target of correction, the output value of each of the comparators C1 through C15 is always as described below. That is, the comparator being the target of correction enters the state in which the input signal voltage has a lower potential than the reference voltage, and its output value becomes "0". Meanwhile a comparator for which correction of the offset voltage has been completed (a comparator whose reference value is lower than that of the comparator being the target of correction) enters the state in which the input signal voltage has a higher potential than the reference value, and its output value becomes "1". In addition, a comparator for which correction of the offset voltage has not been completed (a comparator whose reference value is higher than that of the comparator being the target of correction) enters the state in which the input signal voltage has a lower potential than the reference voltage, and its output becomes "0". Therefore, since output value of all the comparator being the target of correction through the comparator C15 becomes "0", and the output value of all the other comparators becomes "1", the encoder 400 can output a correct value. Therefore, even if the value of the offset voltage generated in each of the comparators C1 through C15 is a voltage value corresponding to equal to or above 1LSB and smaller than 2LSB, correction of the offset voltage for each comparator can be performed properly.

In addition, the ADC according to the present embodiment may be modified, for example, even if the value of the offset voltage generated in each of the comparators C1 through C15 is a voltage value corresponding to equal to or above 2LSB and smaller than mLSB (however, m≧3), to be able to correct it properly. In this case, the ADC according to the present embodiment may be modified so that the correction amount range in which the offset voltage can be corrected with correction data becomes the range of the voltage values corresponding to ±mLSB. In addition, in the offset correction operation, before performing correction of the offset voltage in the order of from the comparator C15 to C1, the correction start position adjustment unit 552 may store correction data indicating the correction minimum value in the correction data holding register 551 as correction data for each comparator. Alternatively, when correction of the offset voltage is to be performed in the order from the comparator C1 to C15, before that, the correction start position adjustment unit 552 may store correction data indicating the correction maximum value in the correction data holding register 551 as correction data for each comparator.

While embodiments have been described above, the present invention is not limited to the embodiments described above, and various improvements and modification may be made without deviating from the gist of the present invention.

For example, the ADC according to each of the embodiments described above may be configured to generate the different 15 reference voltages Vref_lald1 through Vref_lad15 by another means instead of the ladder resistance unit 100.

In addition, for example the ADC according to each of the embodiments described above may be configured to generate the reference voltage input from the ladder resistance unit 100 directly to the comparators C1 through C15 by another means that is different from the ladder resistance unit 100.

In addition, for example, in the ADC according to each of the embodiments described above, the value subtracted from or added to the value of the correction data read out from the correction data holding register 551 by the correction data update unit 540 may be a value other than 1. However, in this case, if the value after the subtraction is smaller than the correction minimum value, the value becomes the correction minimum value, and if the value after the addition exceeds the correction maximum value, the value becomes the correction maximum value. For example, in the ADC according to embodiment 2, it becomes possible to shorten the time required for correction, by setting 2 as the value to be subtracted or added.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment (s) of the present invention has (have) been described in detail, it should be understood that the various changes, substitutions, and alterations could be made hereto without departing from the spirit and scope of the invention.

What is claimed is:

1. An analog-to-digital conversion apparatus comprising:
a plurality of comparators configured to compare each of a plurality of different reference voltages and an input signal voltage in a parallel manner;
a switching unit configured to switch the input signal voltage to an analog input signal voltage, or, either one of the plurality of reference voltages;
a conversion unit configured to convert comparison results of the plurality of comparators into digital signals; and
a correction data generation unit configured to control the switching unit so that the input signal voltage has a potential corresponding to a reference voltage in a comparator being a correction target among the plurality of the comparators, to generate correction data, based on the digital signals converted by the conversion unit, for correcting an offset voltage generated in the comparator being the correction target and to output the correction data to the comparator being the correction target.

2. The analog-to-digital conversion apparatus according to claim 1, wherein
the correction data generation unit comprises:
a storage unit in which correction data for each of the plurality of comparators are stored, and configured to output the stored correction data for each of the plurality of comparators to the plurality of comparator;
a control unit configured to set a comparator being a correction target among the plurality of comparators, and to control the switching unit so that the input voltage has a potential corresponding to a reference voltage;
a determination unit configured to determine a value to be the comparison result of the comparators being the correction target, based on a reference value corresponding to the comparator being the correction target and the digital signal; and
an update unit configured to generate latest correction data based on the value determined by the determination unit and the correction data for the comparator being the correction target stored in the storage unit, and to update the correction data for the comparator being the correction target stored in the storage unit to the latest correction data.

3. The analog-to-digital conversion apparatus according to claim 2, wherein
the update unit is further configured to generate a value in which a certain value is added to or subtracted from a value of the correction data for the comparator being the correction target stored in the storage unit according to the value determined by the determination unit.

4. The analog-to-digital conversion apparatus according to claim 2, wherein
the correction data generation unit is further configured to repeat operations by the determination unit and the update unit until the value determined by the determination unit changes.

5. The analog-to-digital conversion apparatus according to claim 2, wherein
the conversion unit is an encoder configured to output an encode value corresponding to a combination of comparison results of the plurality of comparators as the digital value;

the determination unit is further configured to determine magnitude relationship of the encode value and the reference value; and
the update unit is further configured to perform update with correction data corresponding to the first target relationship as the latest correction data, and stops update of the latest correction data in response to second magnitude relationship of an encode value after correction according to the latest correction data and the reference value being different from the first magnitude relationship.

6. The analog-to-digital conversion apparatus according to claim 2, wherein
the control unit is further configured to select correction data with which an offset voltage generated in the plurality of comparators becomes minimum as the correction data for each of the plurality of comparators, and when setting each of the plurality of comparators sequentially as the comparator being the correction target, performs setting sequentially, starting from a comparator whose reference voltage compared with the input signal voltage is higher.

7. The analog-to-digital conversion apparatus according to claim 2, wherein
the control unit is further configured to select correction data with which an offset voltage generated in the plurality of comparators becomes maximum as the correction data for each of the plurality of comparators, and when setting each of the plurality of comparators sequentially as the comparator being the correction target, performs setting sequentially, starting from a comparator whose reference voltage compared with the input signal voltage is lower.

8. The analog-to-digital conversion apparatus according to claim 2, wherein
the storage unit is further configured to store certain correction data as the correction data for each of the plurality of comparators, before the control unit controls the switching unit so that the input voltage has a potential corresponding to a reference voltage.

9. The analog-to-digital conversion apparatus according to claim 1, further comprising
a voltage generation unit configured to generate the plurality of reference voltages.

10. The analog-to-digital conversion apparatus according to claim 9, wherein
the voltage generation unit is further configured to generate the plurality of reference voltages by dividing a reference voltage using a plurality of resistors.

11. An offset voltage correction method for an analog-to-digital conversion apparatus comprising:
setting a comparator being a correction target among a plurality of comparators configured to compare each of a plurality of different reference voltages and an input signal voltage in a parallel manner;
performing control so that, in the comparator being the correction target, the input voltage has a potential corresponding to a reference voltage of the comparator being the correction target;
converting comparison results of the plurality of comparators into digital signals;
generating correction data, based on the digital signals converted in the converting process, for correcting an offset voltage generated in the comparator being the correction target; and
outputting the correction data to the comparator being the correction target.

12. The offset voltage correction method according to claim 11, wherein the generating process comprises:
- determining a value to be the comparison result of the comparator being the correction target, based on a reference value corresponding to the comparator being the correction target and the digital signal;
- generating latest correction data based on the determined value and the correction data for the comparator being the correction target stored in a storage unit in which correction data for each of the plurality of comparators are stored; and
- updating the correction data for the comparator being the correction target stored in the storage unit to the latest correction data.

13. The offset voltage correction method according to claim 12, wherein
- in the process of outputting, the correction data for each of the plurality of comparators stored in the storage unit is output to the plurality of comparators.

14. The offset voltage correction method according to claim 12, wherein
- in the process of updating, a value in which a certain value is added to or subtracted from a value of the correction data for the comparator being the correction target stored in the storage unit according to the value determined by the determination unit.

15. The offset voltage correction method according to claim 12, wherein
- in the process of generating correction data, the process of determining and the process of updating are repeated until the determined value changes.

16. The offset voltage correction method according to claim 12, wherein
- in the process of converting,
- an encode value corresponding to a combination of comparison results of the plurality of comparators is output as the digital value;
- in the process of determining, magnitude relationship of the encode value and the reference value is determined; and
- in the process of updating, update is performed with correction data corresponding to the first target relationship as the latest correction data, and update of the latest correction data is stopped in response to second magnitude relationship of an encode value after correction according to the latest correction data and the reference value being different from the first magnitude relationship.

17. The offset voltage correction method according to claim 11, wherein
- in the process of setting,
- correction data with which an offset voltage generated in the plurality of comparators becomes minimum is selected as the correction data for each of the plurality of comparators, and when setting each of the plurality of comparators sequentially as the comparator being the correction target, setting is performed sequentially, starting from a comparator whose reference voltage compared with the input signal voltage is higher.

18. The offset voltage correction method according to claim 11, wherein
- in the process of setting,
- correction data with which an offset voltage generated in the plurality of comparators becomes maximum is selected as the correction data for each of the plurality of comparators, and when setting each of the plurality of comparators sequentially as the comparator being the correction target, setting is performed sequentially, starting from a comparator whose reference voltage compared with the input signal voltage is lower.

19. The offset voltage correction method according to claim 12, further comprising, before the process of controlling,
- storing certain correction data as the correction data for each of the plurality of comparators.

* * * * *